United States Patent [19]
Beernink et al.

[11] Patent Number: 5,708,674
[45] Date of Patent: Jan. 13, 1998

[54] SEMICONDUCTOR LASER OR ARRAY FORMED BY LAYER INTERMIXING

[75] Inventors: Kevin J. Beernink, Mountain View; Robert L. Thornton, East Palo Alto; David P. Bour, Cupertino; Thomas L. Paoli, Los Altos; Jack Walker, Sunnyvale, all of Calif.

[73] Assignee: Xerox Corporation, Stamford, Conn.

[21] Appl. No.: 367,554

[22] Filed: Jan. 3, 1995

[51] Int. Cl.$^6$ ............................................. H01S 3/19
[52] U.S. Cl. ........................ 372/50; 372/46; 372/23
[58] Field of Search ............................. 372/50, 23, 46, 372/49

[56] References Cited

U.S. PATENT DOCUMENTS

| | | | |
|---|---|---|---|
| 4,654,090 | 3/1987 | Burnham et al. | 148/1.5 |
| 5,013,684 | 5/1991 | Epler et al. | 437/129 |
| 5,048,040 | 9/1991 | Paoli | 372/50 |
| 5,115,285 | 5/1992 | Menigaux et al. | 372/50 |
| 5,157,680 | 10/1992 | Goto | 372/50 |
| 5,319,655 | 6/1994 | Thornton | 372/23 |

FOREIGN PATENT DOCUMENTS

| | | | |
|---|---|---|---|
| 61-251090 | 11/1986 | Japan | 372/46 |
| 2-43788 | 2/1990 | Japan | 372/50 |
| 2-153585 | 6/1990 | Japan | 372/50 |

OTHER PUBLICATIONS

Koteles, E.S., Elman, B., Holmstrom, R.P., Melman P., Chi, J.Y., Wen, X., Powers, J. Owens, D., Charbonneau, S., and Thewalt, M.L.W., "Modification of the shapes of GaAs/AlGaAs quantum wells using rapid thermal annealing," Superlattices and Microstructures 5, 321 (1989). (No month available).

Deppe, D.G., Guido, L.J., Holonyak, Jr., N., Hsieh, K.C., Burnham, R.D., Thornton, R.L., and Paoli, T.L., "Stripe–geometry quantum well heterostructure $Al_xGA_{1-x}As$–GaAs lasers defined by defect diffusion," Appl. Phys. Lett. 49, 510 (1986). Sep.

Guido, L.J., Jackson, G.S., Plano, W.E., Hsieh, K.C., Holonyak, Jr., N., Burnham, R.D., Epler, J.E., Thornton, R.L., and Paoli, T.L., "Index–guided $Al_xGA_{1-x}As$–GaAs quantum well heterostructure lasers fabricated by vacancy–enhanced impurity–induced layer disordering from an internal $(Si_2)_y(GaAs)_{1-y}$ source," Appl., Phys. Lett. 50, 609 (1987). Mar.

O'Brien, S., Bour, D.P., and Shealy, J.R., "Disordering, intermixing, and thermal stability of GaInP/AlGaP superlattices and alloys," Appl. Phys. Lett. 53, 1859 Nov. 1988.

(List continued on next page.)

*Primary Examiner*—Rodney B. Bovernick
*Assistant Examiner*—Yisun Song
*Attorney, Agent, or Firm*—Oliff & Berridge

[57] ABSTRACT

A fabrication process and several structures for an index-guided laser diode formed by IILD or for a multiple wavelength laser array containing stacked semi-conductive active layers with quantum wells. The laser wavelength is varied laterally by effectively inactivating quantum wells which have transition wavelengths longer than that desired in the selected portion of the device. The quantum wells are inactivated by intermixing them with the surrounding high band gap semiconductor layers. To accomplish this intermixing without affecting the active layer in nearby regions, a finite source of impurity inducing or promoting intermixing is located in proximity to the quantum well to be intermixed, and the sample is annealed under conditions which allow for lateral patterning of the impurity-induced intermixing. Alternatively, the body is capped over the quantum well to be inactivated with a material which induces vacancies in semi-conductive material during thermal annealing, thus promoting vacancy-enhanced intermixing of the undesired quantum well. The intermixing can also be brought about by patterned annealing or selective laser heating which produces local annealing, or by use of two different caps. For the index-guided laser diode, the flanking index-guiding regions are formed by IILD from a buried impurity source, in which surface conditions are controlled to promote impurity diffusion to the flanking regions but not to the active stripe region between the flanking regions.

26 Claims, 23 Drawing Sheets

OTHER PUBLICATIONS

Ralston, J.D., O'Brien, S., Wicks, G.W., and Eastman, L.F., "Room–temperature exciton transitions in partially intermixed GaAs/AlGaAs superlattices," Appl. Phys. Lett. 52, 1511 May 1988.

Deppe, D.G., Guido, and L.J., Holonyak, Jr., "Atom diffusion and impurity–induced/layer disordering in quantum well III–V semiconductor heterostructures", J. Appl. Phys. 64 (12) R93 Dec. 1988.

Mei, P., Yoon, H.W., Venkatesan, T., Schwarz, S.A., Harbison, J.P., "Kinetics of silicon–induced mixing of AlAs–GaAs superlattices", Appl. Phys. Lett 50 (25), 1823 Jun. 1987.

L.J. Guido, W.E. Plano, G.S. Jackson and N. Holonyak, Jr., "Coupled–stripe $Al_xGa_{1-x}As$–GaAs quantum well lasers defined by vacancy–enhanced impurity–induced layer disordering from $(Si_2)_y(GaAs)_{1-y}$ barriers," Appl. Phys. Lett. 50, 757 Mar. q1987.

Guido,L.J.,et al.,"Index–guided AlxGa1–xAs–GaAs quantum well heterostructure..." Appl.Phys.Lett.50(10) Mar. 9, 1987,pp. 609–611.

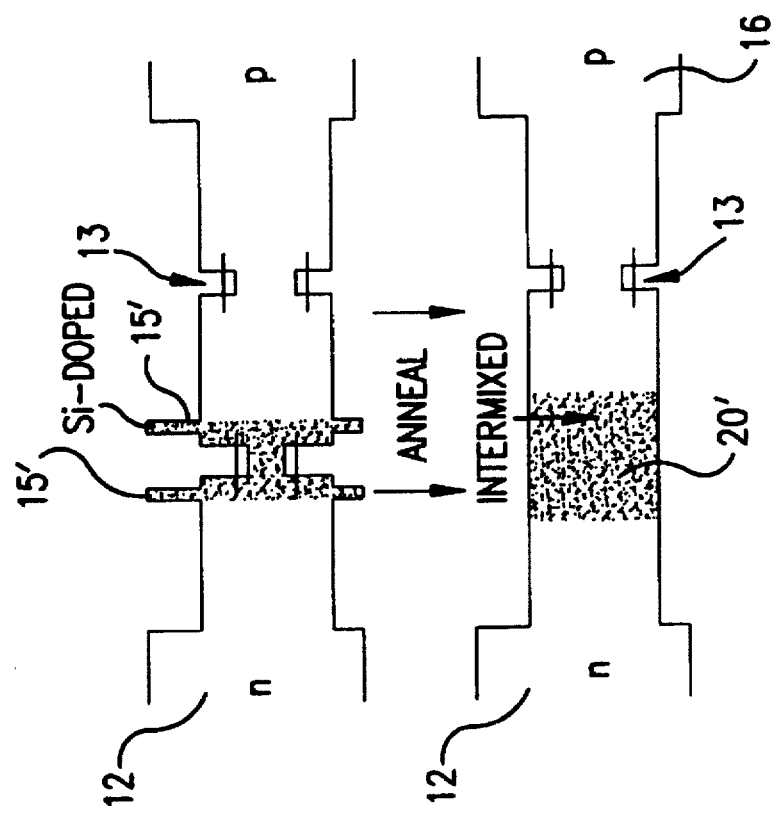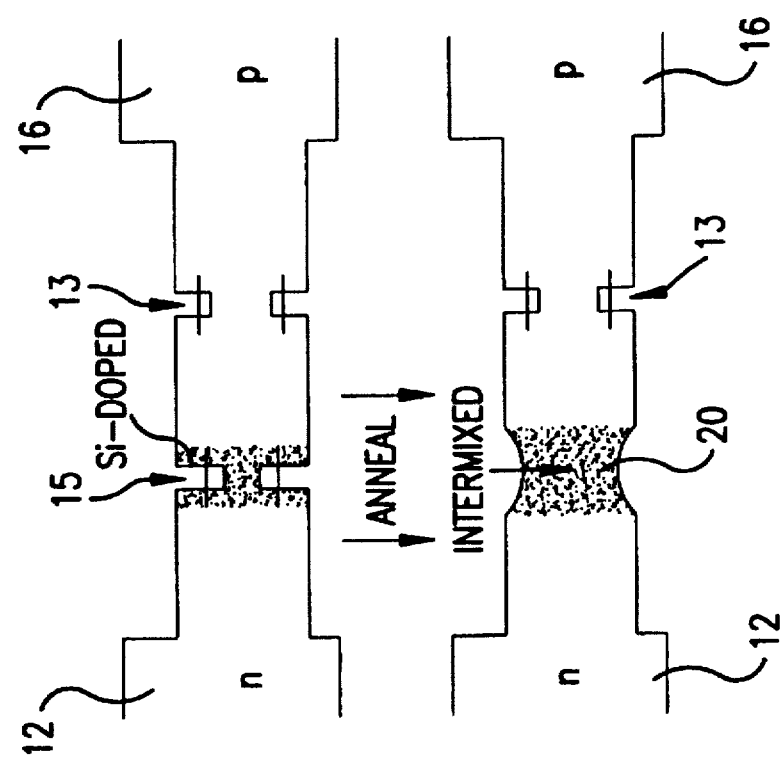

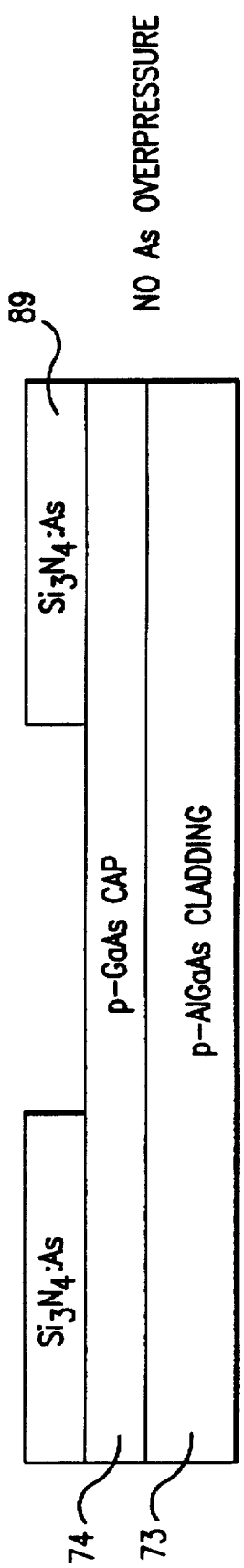
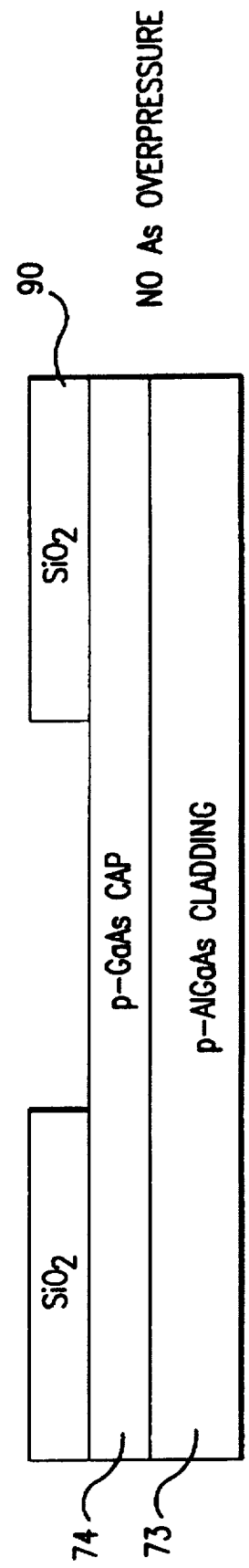
FIG.19A
FIG.19B

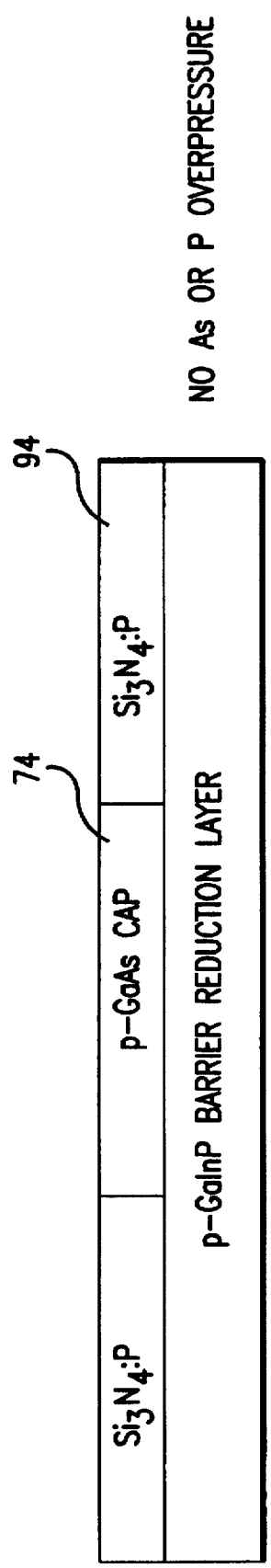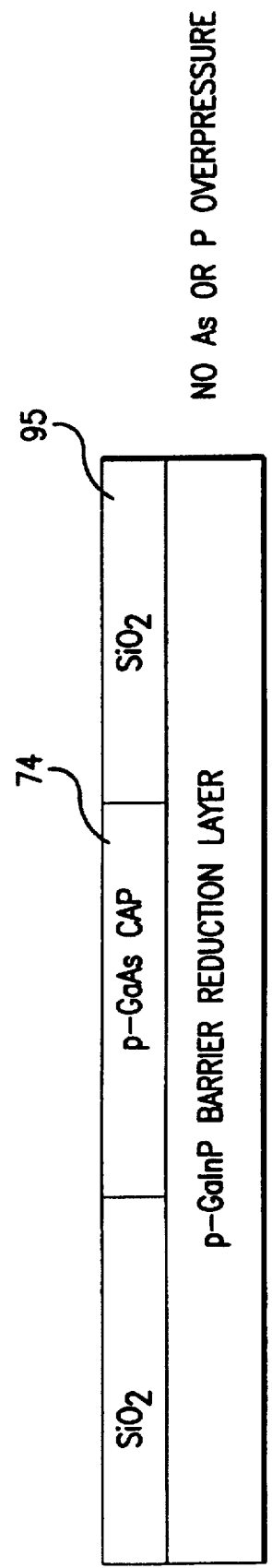
FIG.20A
FIG.20B

SEMICONDUCTOR LASER OR ARRAY FORMED BY LAYER INTERMIXING

The U.S. Government has certain rights in the invention as provided by the terms of Advanced Technology Program Award 70NANB2H1241 awarded by Department of Commerce.

This invention relates to semiconductor devices, and in particular to III–V semiconductor laser devices and methods of making such devices by layer intermixing.

RELATED APPLICATIONS

Commonly-assigned application, Ser. No. 08/146,752, filed Nov. 2, 1993, entitled "Method of Fabricating A Stacked Active Region Laser Array".

Commonly-assigned application, Ser. No. 08/146,651, filed Nov. 2, 1993, entitled "Stacked Active Region Laser Array for Multicolor Emissions".

BACKGROUND OF THE INVENTION

During the fabrication of semiconductor laser devices, it is sometimes desirable to remove a layer or layers which are buried within the structure, while maintaining the structure above and below. For example, the fabrication of a device may require a regrowth over an $Al_xGa_{1-x}As$ layer as in FIG. 1A. As the aluminum fraction of this layer increases, the regrowth becomes increasingly problematic due to oxidation of the exposed $Al_xGa_{1-x}As$ surface. It is thus desirable to do the regrowth over a layer with a low aluminum fraction, ideally a layer of GaAs, as shown in FIG. 1B. However, the resulting layer structure would then contain an unwanted buried layer of GaAs which may degrade or prevent laser operation. Removal of this buried GaAs layer by some method would then result in the desired structure. We know of no method presently available to accomplish this.

In another context, multi-wavelength semiconductor laser arrays are important in such applications as multicolor printing. See, for example, U.S. Pat. No. 5,319,655 and the two related applications referenced above, whose contents are herein incorporated by reference.

The stacked active region structure described in those references is attractive because it provides multiple semiconductor laser spots in close lateral proximity, but with wide spectral separation from one spot to the next. This is particularly useful in enabling advanced techniques for multicolor printing. The stacked active region structure was described in U.S. Pat. No. 5,319,655 with respect to lasers of the surface-skimming variety (with lateral current injection), and for buried heterostructure devices (with vertical current injection), in the referenced related applications. The latter geometry is more attractive because it relies on more well-developed fabrication technology, and allows for more symmetrical beams with lower divergence.

The stacked active region design utilizes the natural tendency of carriers to preferentially populate the lowest energy active region in the structure, resulting in lasing of the lowest energy active region. Therefore, to form a multiple-wavelength laser array using the stacked active region design, the longer wavelength active region(s) must be removed from the stack in the areas where a shorter emission wavelength is desired. This is a major difficulty in fabrication of the devices.

The fabrication of a stacked active region laser array with vertical injection, described in the first related application, Ser. No. 08/146,752, uses etching to remove undesired selected active regions, followed by regrowth to complete the layers. This results in a nearly-planar surface, and dual-wavelength index-guided devices have been built in the AlGaAs materials system using this technique. However, this approach requires a regrowth at the edge of the quantum well active region, and that has thus far prevented high-performance operation of lasers in the AlGaInP (red wavelength) materials system. In addition, the regrowth near the active region could be expected to have a negative effect on the reliability of devices formed in this way.

In still another context, the use of impurity-induced layer disordering (IILD) to form index-guided laser diodes in the AlGaAs material system is well known. To form the structure, appropriate layers are first grown in a planar fashion. Then, an impurity, typically silicon, is diffused into the material from a source layer deposited on the surface. A masking layer, typically silicon nitride, is used to block the indiffusion in selected areas. Next, following removal of the mask and Si source layers, a zinc diffusion is conventionally performed in order to move parasitic shunt junctions into higher band gap material, and to improve the contact to the top of the structure. In AlGaAs, the formation of high-performance index guided lasers in this fashion is well-developed. In the AlGaInP materials system, problems have been encountered, specifically, the slow diffusion rate of Si in such materials, and the difficulty in avoiding the shunt junction formed by the Si-diffused n-type material regions flanking the active region.

SUMMARY OF THE INVENTION

An object of the invention is a method for effectively removing unwanted buried layers in the fabrication of certain kinds of semiconductor laser devices.

Another object of the invention is a semiconductor stacked active region laser device having unwanted buried layers effectively removed during fabrication.

A further object of the invention is a semiconductor laser providing multiple semiconductor laser spots in close lateral proximity but with wide spectral separation between the spots.

Still another object of the invention is the fabrication of index-guided laser diodes by IILD at lower temperatures and for shorter diffusion times and without the need to remove shunt junctions formed by the flanking intermixed regions.

In accordance with one aspect of the present invention, by doping the unwanted layer during growth with an impurity for impurity-induced layer intermixing, the layer can later be effectively removed by annealing. By intermixing we mean that for two or more layers of different composition, the constituent elements of the layers mix together either partially or completely. In the limiting case, the layers are then "replaced" by a layer whose composition is the average of the initial layers (weighted by initial layer thicknesses). Because the intermixing occurs more slowly as the impurity concentration decreases, the extent of the intermixing is self-limiting as the impurity concentration decreases due to diffusion of the impurities into a larger volume during the anneal. By including the proper concentration of impurity in the initial layer(s), the range of intermixing perpendicular to the interfaces can be limited to a very small distance around the layer, thus leaving other nearby layers intact. It will be noted that, as distinguished from other approaches to the problem, the unwanted layers in the stacked active region laser array are not actually physically removed from the structure, but are eliminated by being intermixed with adjacent layers to raise the band gap and thus prevented from interfering with the desired operation of adjacent parts of the structure.

In accordance with another aspect of the present invention, devices made in accordance with the invention do not require a regrowth near the active region, and thus are not subject to the accompanying drawbacks.

In accordance with still another aspect of the present invention, instead of removing the undesired long wavelength active region from a portion of a stacked active region structure by etching (followed by a regrowth of the upper cladding layer), the long wavelength quantum well is eliminated by intermixing it with surrounding barrier layers to raise its band gap above that of the shorter wavelength active region(s). A finite source of impurity is included in, and/or in close proximity to, the quantum well to be intermixed. Because the source of the impurity is finite, the intermixing is localized around the initially doped layer, and the other nearby quantum well desired for shorter wavelength emission is left intact. Certain capping conditions are preferably used to allow the impurity to intermix the long wavelength quantum well in some portions of the device, while other capping conditions prevent the intermixing in other portions.

In accordance with an alternative aspect of the invention, selective elimination of the unwanted quantum well of the laser array is achieved through vacancy-enhanced intermixing at the regions adjacent the unwanted quantum well by promoting vacancies in the region adjacent the unwanted quantum well. By choosing materials which have a much higher vacancy-enhanced intermixing rate for the long wavelength quantum well and barriers as compared to the short wavelength quantum well and barriers, the long wavelength quantum well is selectively intermixed. A preferred method is, during the thermal annealing step, to selectively cap the structure over the unwanted quantum well with a material such as $SiO_2$ that absorbs constituents of the underlying semiconductor alloy and thus acts as a source of vacancies.

This alternative aspect differs from the above described approach in that no impurity is needed to enhance diffusion, and the desired interdiffusion is promoted by selectively creating vacancies in or adjacent the regions to be interdiffused. Put another way, the first approach is the introduction of impurities in combination with selective capping to enhance diffusion, whereas the second approach is selective introduction of vacancies to enhance diffusion. Both approaches can be combined into a single process, for example, patterning the introduction of Si as the diffusion-enhancing impurity only at the regions where the active layer is to be removed, and patterning capping layers of $SiO_2$ as the vacancy-enhancing material only over the region where the active layer is to be removed. A number of publications have reported on the phenomena of impurity-induced and vacancy-enhanced intermixing, describing the materials used, and the annealing conditions, and the contents of these publications, which are identified in the annexed Appendix, are incorporated herein by reference. However, to the best of our knowledge, none of these publications have shown or suggested that the techniques they describe can be applied to selectively inactivate one critical region of a laser array without detrimentally affecting closely adjacent critical regions, nor have any suggested that their techniques can be applied to selectively disable an active region in a stacked active buried region laser array structure for generating multiple semiconductor laser spots at different wavelengths.

In accordance with still another aspect of the present invention, an impurity source buried in the initial layers is applied not for the purpose of removing an unwanted layer, but instead for the purpose of creating index-guided regions flanking the active region of the device, preferably by IILD. Because the source of impurities is located much closer to the waveguide layers where intermixing is desired, the required impurity diffusion distance and thus the anneal time and temperature are reduced compared to diffusion from a surface source. In addition, the parasitic junctions following the diffusion are located in high band gap material. Therefore there is no need to convert diffused material back to p-type. Although these benefits are of much greater importance for lasers in AlGaInP emitting at red wavelengths, the technique is applicable to AlGaAs lasers as well.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

SUMMARY OF DRAWINGS

In the drawings:

FIGS. 4(a)–4(b) are a sequence of energy band diagrams showing the effects of doped layer intermixing in accordance with the invention;

FIGS. 19a and 19b and FIGS. 20a and 20b show various techniques for controlling surface conditions during the IILD step to promote impurity diffusion outside the active strip region and inhibit impurity diffusion into the latter.

DETAILED DESCRIPTION OF THE PREFERRED EMBODIMENTS

Figure 1A:
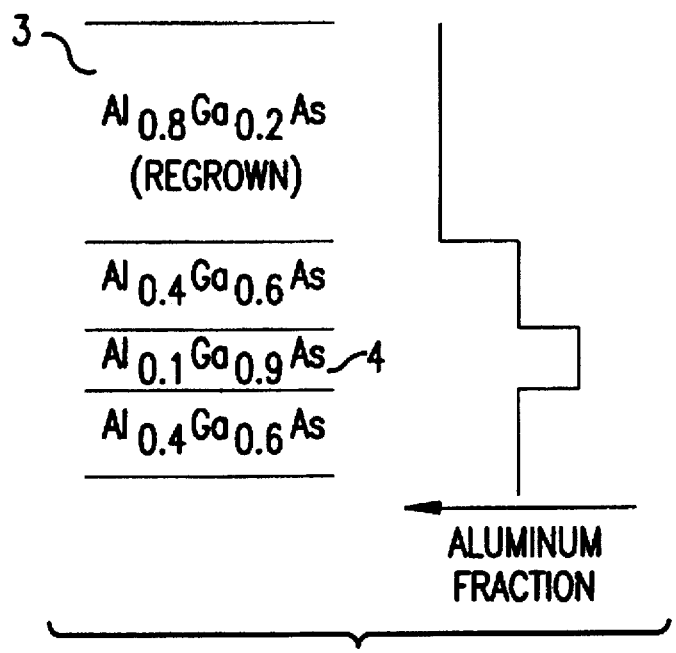
FIG. 1A schematically illustrates a cross-section on the left and on the right a graph of aluminum content for the various layers shown of a desired semiconductor structure after regrowth.
Figure 1B:
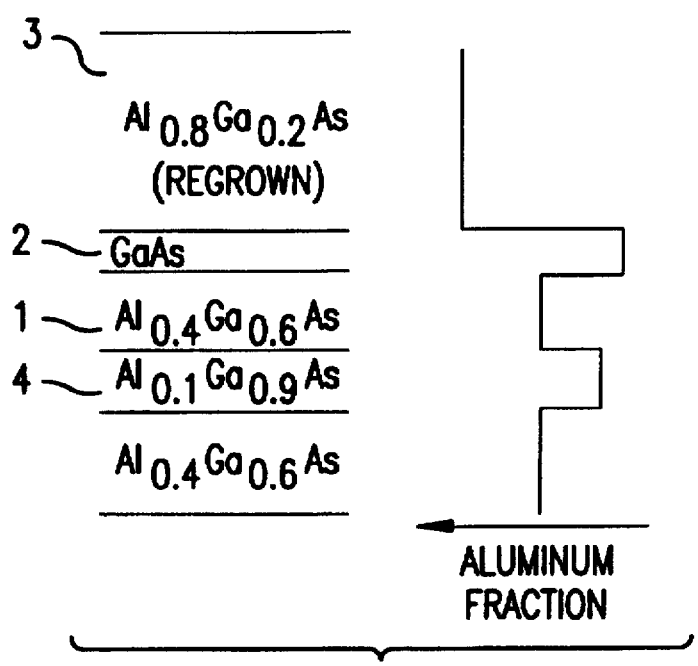
FIG. 1B is a view similar to FIG. 1A of the actual semiconductor structure after regrowth producing an undesired buried layer of GaAs.
Figures 2A, 2B, 2C:
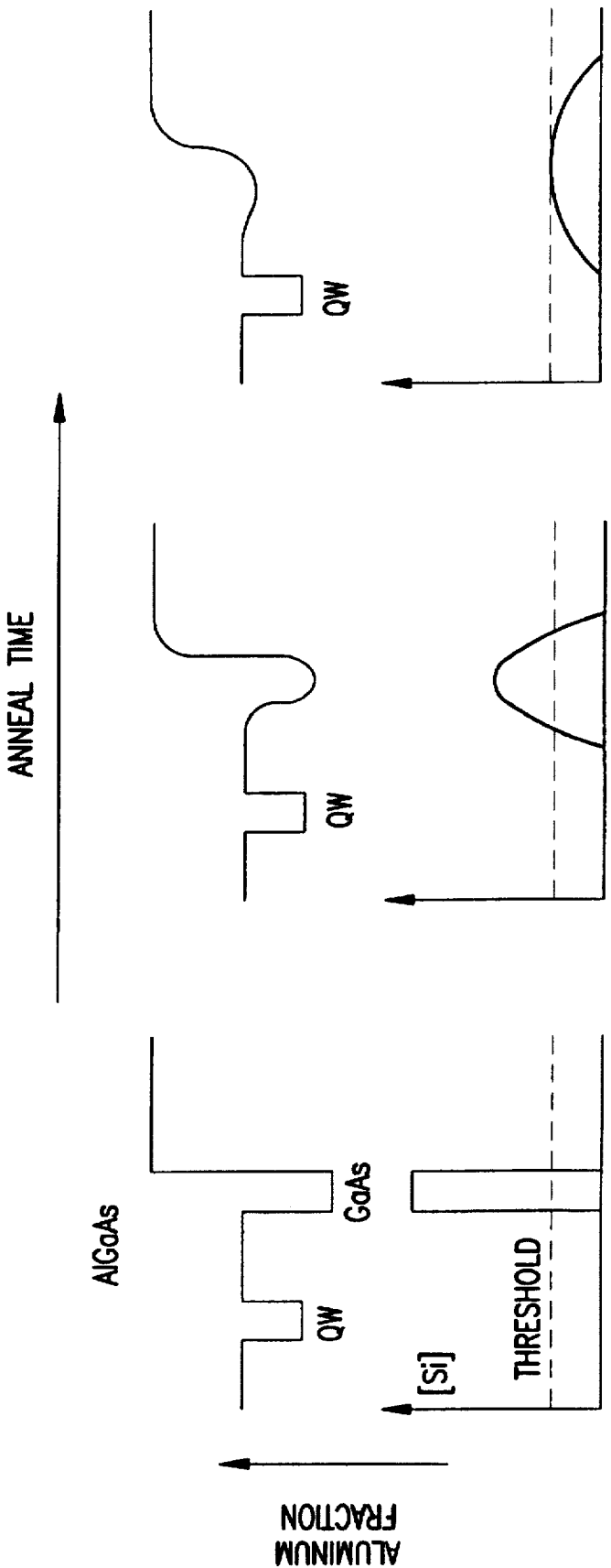
FIG. 2 shows in a series of graphs labelled (a), (b) and (c) the evolution of the Al fraction and Si impurity concentration during an annealing step in the fabrication of one form of a device according to the invention.

FIG. 2 illustrates the concept of finite-source impurity-induced layer intermixing. As described earlier, in the manufacture of certain III-V semiconductor laser devices, it may be desirable to regrow a layer on top of an aluminum-containing layer such as AlGaAs to produce the structure of FIG. 1A, but instead in order to avoid difficulty with oxidation of the layer to be grown upon, a layer of GaAs 2 is added in the initial structure to give a good regrowth surface. This GaAs layer, which is undesired in the final (regrown) structure, appears under the regrown layer 3 as illustrated in FIG. 1B. For the example in the figure, a finite amount of an impurity such as silicon is used to effectively remove the GaAs layer 2 from the AlGaAs structure, while leaving a nearby thin quantum well (QW) layer 4 intact. All of the Si is initially in the GaAs layer 2, with the concentration well above the threshold for layer intermixing, as in FIG. 2(a). See J. Appl. Phys. 64 (12), 15 Dec. 1988, pgs. R93–R113; Appl. Phys. Lett. 50 (25), 22 Jun. 1987, pgs. 1823–1825 for a more detailed description of impurity intermixing and an explanation of "threshold for layer intermixing". For AlGaAs, at an anneal temperature of 850° C., this threshold value for Si is on the order of $3 \times 10^{18} cm^{-3}$. The surface of the structure is capped with $Si_3N_4$ (not shown) or another suitable barrier material to prevent the loss of column III or column V species from the surface during the anneal. The sample is then annealed at a temperature sufficiently high as to result in impurity-induced layer intermixing for impurity concentrations above the threshold level. In the example here, the temperature would be on the order of 850° C.

As the anneal proceeds, the Si begins to diffuse out of the GaAs layer into a larger volume, and thus the concentration decreases. Since the Si concentration on both sides of the interface is above the threshold for intermixing, the interfaces between the GaAs layer and the surrounding layers will begin to intermix, as shown in FIG. 2(b). After a certain time period, the Si will have diffused into a sufficiently large volume that the concentration everywhere at any point is below the threshold for intermixing (FIG. 2(c)). At this time, the intermixing will be greatly reduced or stops. Since the Si concentration at the interfaces of the nearby QW did not exceed the threshold value, the QW remains unaffected and intact.

The technique described above provides for intermixing buried III-V semiconductor layers over a limited range in a direction perpendicular to the interfaces (vertical in FIG. 1; horizontal in FIG. 2) through the use of a finite impurity source contained within or adjacent the buried layer to be removed. The intermixing distance is self-limited by the total amount of impurity in the layers prior to annealing. In the example illustrated in FIGS. 1B and 2, the intermixing impurity is initially incorporated in the unwanted GaAs layer. During the subsequent anneal cycle, some of the Ga in the GaAs layer was replaced by Al by interdiffusion of the Al and Ga atoms, as promoted by the silicon. Alternatively, Si, or other intermixing-enhancing impurity, could be deposited (FIG. 1B) in the portion of the middle $Al_{0.4}Ga_{0.6}As$ layer 1 adjacent to the unwanted layer 2 and act to promote Al diffusion into the unwanted GaAs region 2 (with corresponding Ga diffusion into the $Al_{0.4}Ga_{0.6}As$ region 1) so that its composition is modified and it effectively becomes an extension of the middle layer 1 (FIG. 1A). In both instances, via impurity-induced layer intermixing, a thin buried layer was removed while preserving the structure above and below. By proper choice of the impurity content and its location, intermixing is confined to the immediate area surrounding the impurity, and the distance over which the intermixing occurs is self-limiting by the total amount of impurities in the layers prior to intermixing. This is what is meant by a "finite" source; since the overall impurity content remains fixed during the anneal, the intermixing distance can be controlled to thus avoid undesirable effects in adjacent desired layers, such as the QW in FIG. 2 and the QW layer 4 in FIG. 1B. This means that the starting impurity content must exceed the threshold value in amounts sufficient to obtain the desired local intermixing, but not too high, to ensure that as the anneal continues its concentration will in due course fall below the threshold and no further intermixing will occur as the impurity diffusion front begins to approach a wanted layer. In general, the concentration of the Si will be chosen to lie in the range of $1 \times 10^{18} cm^{-3}$–$1 \times 10^{19} cm^{-3}$ for an anneal temperature range of 700° C.–1000° C. Under these conditions, the layer intermixing will be effective over a distance of about 20–2000 nm from the original location of the Si-doped region, and the actual distance depends strongly on the particular concentration and temperature, with high concentration and/or temperature resulting in a greater distance.

The invention is not limited to the use of Si as the impurity for inducing layer intermixing. As will be clear from the cited patents and publications, other impurities behave similarly to promote layer intermixing, such as Ge, Zn, Sn and Se. The cited publications give examples of concentrations of these other impurities to obtain layer intermixing.

The process of the invention is very useful in the fabrication of stacked active region multi-wavelength lasers in the AlGaAs material system as described in the two related applications, where a thin layer of AlGaAs with a low Al fraction is used as an etch stop layer and regrowth surface. Once the regrowth is performed on that structure, the etch stop layer forms no useful function. Rather, the etch stop layer degrades the performance of the lasers. The use of finite-source impurity-induced layer intermixing in accordance with the invention to intermix this etch stop layer with adjacent layers, while leaving nearby quantum wells intact, will improve the performance of the regrown stacked active region multi-wavelength devices.

Figure 3:
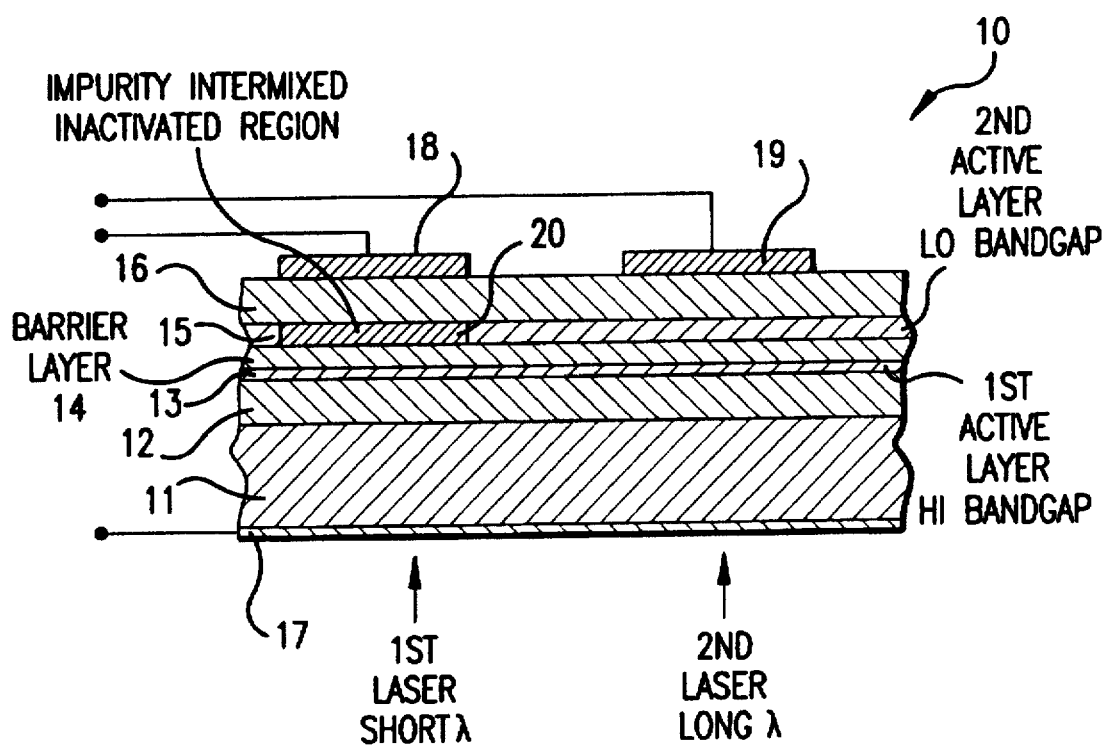
FIG. 3 is a cross-section of one form of stacked active region laser in accordance with the invention.

FIG. 3 is a cross-section schematically illustrating a multi-wavelength stacked active region laser made in accordance with the invention. The vertical and lateral dimensions are not to scale for clarity and typical actual dimensions can be found in the referenced related applications, patents, and publications. The multi-wavelength laser comprises a structure 10 formed by a substrate 11 on which are epitaxially grown by well known methods a lower cladding layer 12, a first active layer 13, a separating barrier layer 14, a second active multi-layer 15, and an upper cladding layer 16. The first active layer 13 is of a material having a higher band gap than that of the QW in the second active multi-layer 15, which contains at least one quantum well and barrier layers, on each side of the quantum well, of higher band gap than the quantum well. The active layer 13 preferably also contains a quantum well, but need not. The intermixing where desired is usually between the barrier layers and the QW layer of multi-layer 15, which are very thin, and thus intermixing over only a short distance is required. Since no intermixing is desired for the active layer 13, it need not comprise thin layers and thus can be of bulk material. A common substrate electrode 17 is provided at the bottom, and spaced electrodes 18, 19 are provided at the top whereby, by applying voltages between the left electrode 18 and substrate electrode 17, or between the right electrode 19 and substrate electrode 17, current can be individually passed through the structure at the left or at the right or through both as desired. The structure at the right labelled "2nd laser" with both active layers potentially active, upon the passage of current, will actually lase at the longer wavelength of the second active multi-layer, because the latter has the lower band gap and the injected carriers preferentially populate the lowest energy active layer in the structure. However, absent the invention, the structure on the left labelled "1st laser" would also lase at the longer wavelength of the second active layer. To force the 1st laser on the left to lase at the shorter wavelength (higher energy) of the higher band gap of the first active layer, the double cross-hatched region 20 of the second active layer must be disabled in the structure. This can be accomplished by modifying the composition of the region 20 so that its band gap is higher than that of the first active layer. In the latter case, at the left structure, the lower energy active layer preferentially populated would be the first active layer and not the second active layer. The problem, however, is how to modify the composition of the buried region 20 without changing the composition of the first active layer portion beneath or that of the second active layer portion at the right hand side, bearing in mind that the typical spacing, laterally, of the first and second lasers is 10 to 500 micron, and the typical spacing, vertically, of the first and second active layers is 20 to 500 nm.

The solution of the invention, in the stacked laser structure shown, to eliminate the unwanted region 20 in the first laser on the left, is to selectively promote intermixing of the second active multi-layer 15 only in region 20. There are several ways in accordance with the invention to do this. In a first method, the active multi-layer 15 has an impurity, e.g., Si, incorporated in it when grown. Then selective capping conditions are used to control where the impurity will intermix the QW in the active multi-layer 15 to raise its band gap above that of layer 13. A cap layer of $SiO_2$ can be laterally patterned over the grown structure including upper cladding 16 to provide the $SiO_2$ cap where intermixing is desired, i.e., over region 20.

Alternatively, a second method (further described below) is to use selective capping after layer 15 with the incorporated impurity is grown, thermally anneal to selectively intermix, strip off the patterned cap, and grow the remaining layers.

A third method (also described below) is to selectively incorporate the impurity where intermixing is desired by stopping the growth after active layer 15, masking the surface (e.g., with $Si_3N_4$) and depositing Si so that it contacts the layer 15 in windows over where intermixing is desired. Annealing is then carried out to intermix, the Si and $Si_3N_4$ stripped from the surface, and the remaining layers grown over layer 15.

FIG. 4 illustrates band diagrams of the multiple layers in a dual-wavelength (for example, 780 and 850 nm) stacked active region laser in the AlGaAs material system. The impurity-doped region is shaded. The upper and lower figures respectively show the band diagrams before and after the anneal. Note that the resultant band gap of region 20 in the lower figures is now larger than that of the QW 13. In both FIGS. 4(a) and 4(b), the Si-doped layers intermix during the anneal. Nearby layers are not affected, because the finite Si decreases in concentration as it diffuses. In FIG. 4(b), additional thin layers 15' are included to result in a flatter composition profile in region 20' after the anneal. In this example, the AlGaAs QW 15 with a wavelength of 850 nm before intermixing was intermixed to force operation at 780 nm associated with the larger band gap QW 13. The second active layer portion 15 intermixes with the surrounding structure parts thereby to form the intermixed region 20 with the higher band gap that effectively removes it from the structure by rendering it inactive as the lowest energy active layer.

Figure 5:
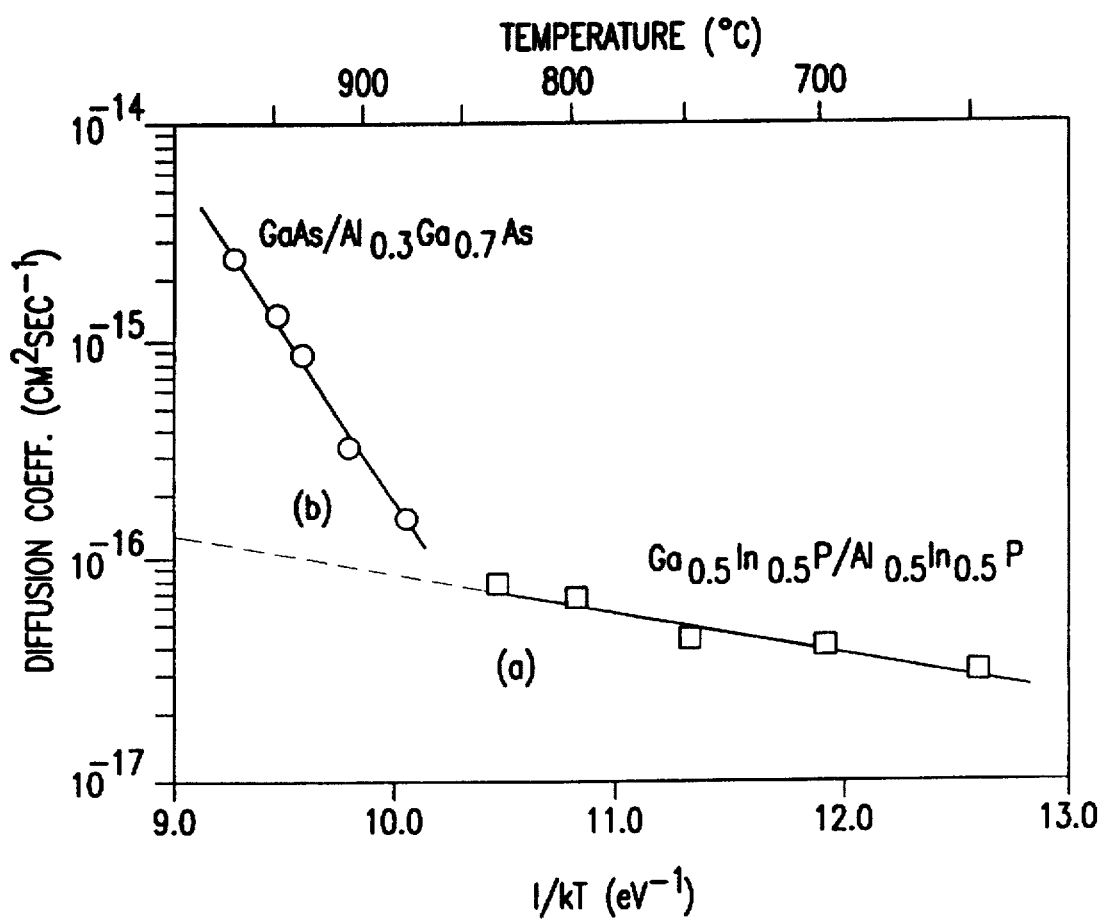
FIG. 5 is an Arrhenius plot of the Al-Ga interdiffusion constants of various materials.
Figure 6A:
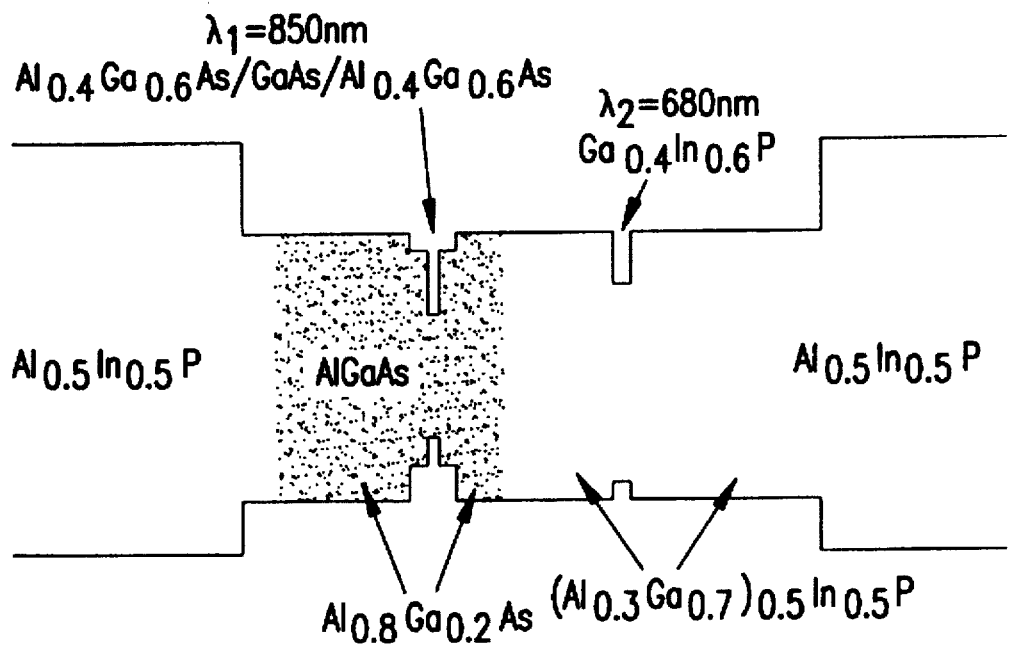
FIGS. 6(a) and 6(b) are views similar to FIG. 4 showing the effect of layer intermixing in a particular III–V structure.
Figure 6B:
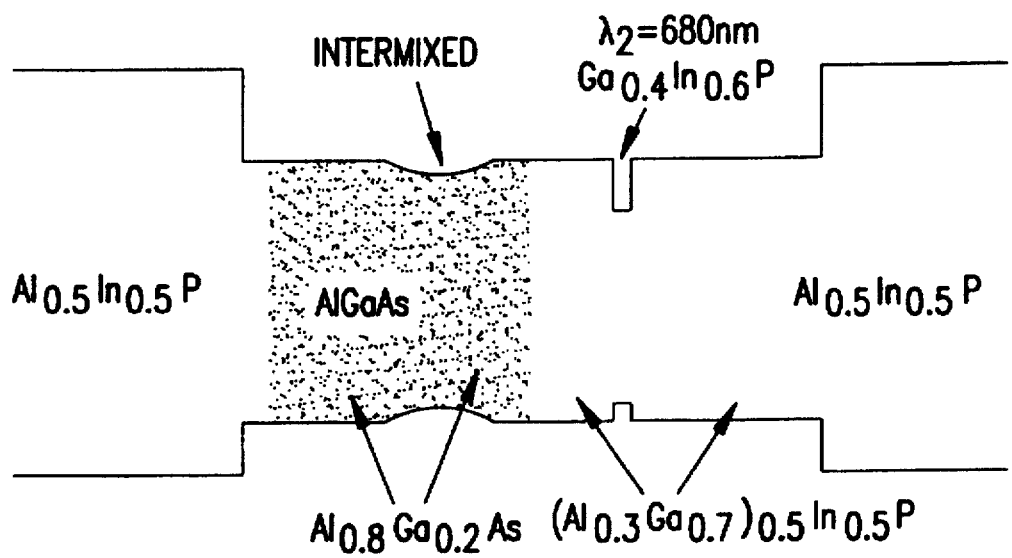

The concept underlying the invention as applied to the stacked active region laser array thus involves intermixing the longer wavelength quantum well 15 with the surrounding layers, while preserving the shorter wavelength quantum well 13. A preferred method described below utilizes the large difference in the Al-Ga interdiffusion coefficients for the AlGaAs and AlGaInP materials systems during vacancy-enhanced intermixing promoted by a source of Ga vacancies. FIG. 5 is an Arrhenius plot that shows the results of a measurement of the diffusion constants for Al—Ga interdiffusion in $SiO_2$-capped superlattices of $Ga_{0.5}In_{0.5}P/Al_{0.5}In_{0.5}P$ [curve (a) in FIG. 5] and $GaAs/Al_{0.3}Ga_{0.7}As$ [curve (b) in FIG. 5] during rapid thermal annealing [1,6]. Bracketed numbers identify published papers listed in the Appendix. By "thermal annealing" is meant heating at a temperature typically in the range of 700°–1000° C. and holding it within that temperature range for 1 to 100 hours. By "rapid thermal annealing" is meant ramping up to the temperature range indicated above within 1 min. or less, and cooling down within 10 min. or less. The much lower activation energy for AlGaInP (0.4 eV vs. 3.6 eV for AlGaAs) suggests that for temperatures above 900° C., the Al—Ga interdiffusion coefficient is significantly higher in AlGaAs, as shown by the dashed extrapolation in the figure. In experiments we have performed to demonstrate the different interdiffusion rates, under the same annealing conditions, the lasing wavelength of an AlGaAs QW structure shifted from 840 nm to 788 nm due to intermixing, whereas an AlGaInP QW structure remained at 675 nm±1 nm, indicating virtually no intermixing. This large difference in interdiffusion rates enables the intermixing of an unwanted AlGaAs or GaAs quantum well with its surrounding AlGaAs barriers, while leaving a desired AlGaInP or GaInP quantum well and surrounding AlGaInP barriers essentially intact. Thus, a stacked active region structure, which would lase at the IR wavelength as-grown, and which contains one AlGaAs quantum well for IR emission and one AlGaInP quantum well for red emission can be converted to operate at the red wavelength by intermixing the AlGaAs (IR) layers. This is illustrated for the wavelengths of 680 nm and 850 nm in FIG. 6, which is similar to FIG. 4 but with the compositions indicated before annealing (a) for operation at 850 nm and after (b) annealing for operation at 680 nm. In (a), laser operation is at 850 nm while in (b) laser operation is at 680 nm.

In general, as used herein, unless the context indicates otherwise, "active region" means one or more thin layers comprising one or more QW layers typically 20 nm or less in thickness (if more than one usually separated by a thin barrier layer), and including if present flanking confinement layers which typically have a higher band gap than that of the QW layer. For example, for an AlGaAs QW layer, the confinement layers can have the same three constituents but with a higher Al content which increases their band gap. Thus, an AlGaAs QW layer can have its band gap raised by intermixing it with its flanking confinement layers having a higher Al content, so that the Al content of the QW layer is raised.

The intermixing is preferably achieved in this embodiment by capping the structure with $SiO_2$ and annealing. During the anneal to intermix the AlGaAs QW, the AlGaInP QW may be partially intermixed and experience a small wavelength shift. This shift should be minimal because of the large difference in the Al—Ga interdiffusion coefficients, and can be further minimized by judicious selection of well widths. The wavelength shift associated with partial intermixing of a quantum well is larger for a narrower well, so that further discrimination between the extent of wavelength shift of the IR and red quantum wells can be obtained by using a narrow well (smaller than about 100 Å) for IR, where extremely large shifting is desired, and a wide well (greater than about 100 Å) for the red, where minimal shifting is desired. The limiting case of this, where the red portion is wide enough to behave as bulk rather than as a quantum well, would eliminate shifting of the red wavelength during the anneal. Thus one possible variation of the invention is to replace the AlGaInP QW active region with a wider (greater than about 200 Å) $(Al_xGa_{1-x})_{0.5}In_{0.5}P$ layer which would behave as bulk material. Alternatively, or in addition, the AlGaAs active region can be optimized by including thin layers of higher Al composition [shown at 15' in FIG. 4(b)] to enhance the band gap increase upon intermixing.

Figure 7:
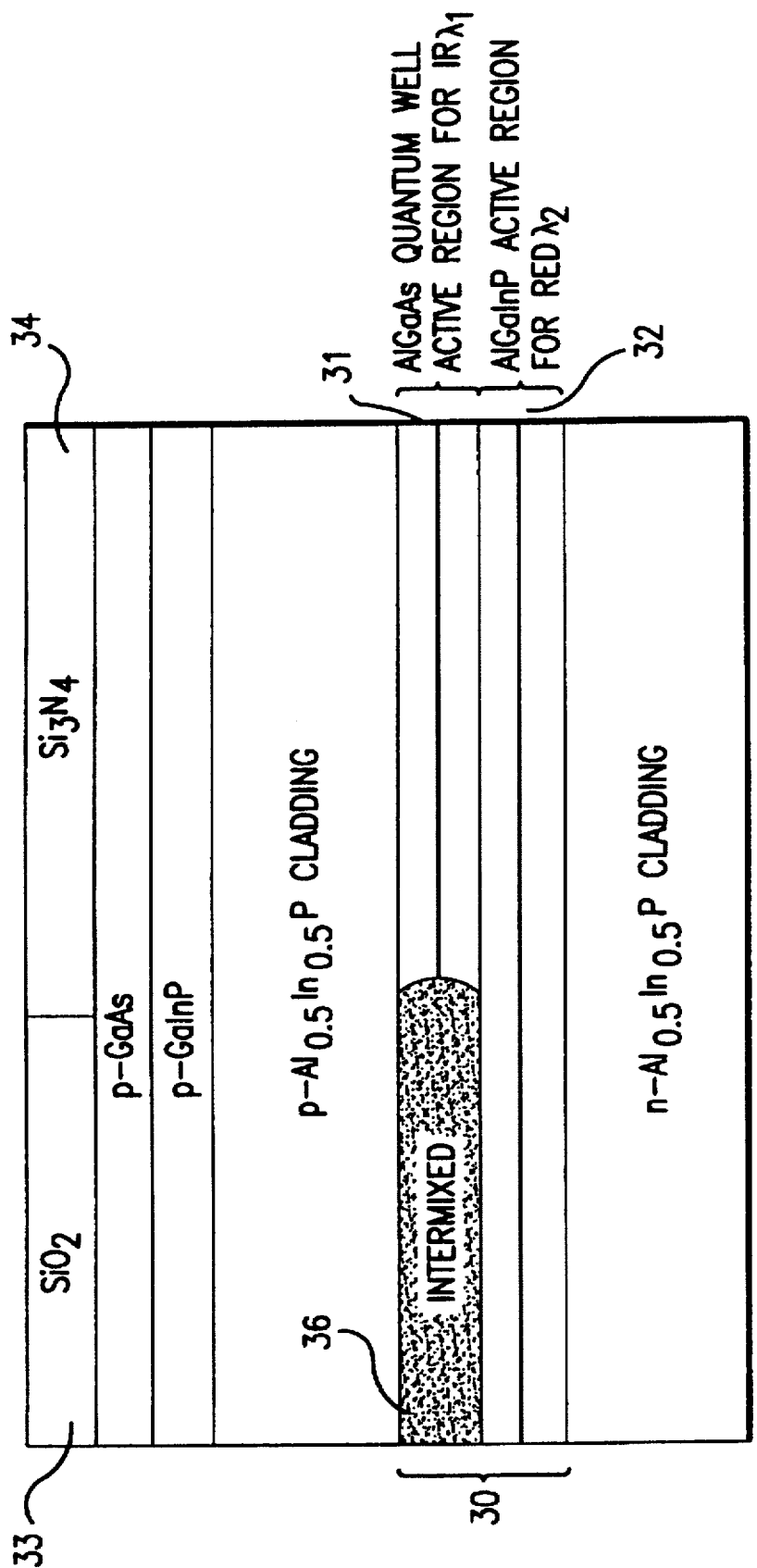
FIG. 7 is a cross-sectional schematic view of another form of device according to the invention during fabrication.

FIG. 7 shows how the process of the invention can be used to form a dual-wavelength (red and IR) laser array. The stacked active region layer structure 30 is grown containing an AlGaAs QW active region 31 for IR emission, and an AlGaInP QW active region 32 for red emission. Then portions of the surface are selectively covered with $SiO_2$ 33, and the remainder is covered with an $Si_3N_4$ cap 34. Next, the wafer is subjected to a high temperature anneal (in the range of about 800° to 1000° C.) for about 8 hours. The anneal could be performed with the surface in contact with a GaAs wafer, or in a sealed ampoule with controlled As pressure. During the anneal, the $SiO_2$ cap 33 acts as a source of Ga vacancies by absorbing out-diffusing Ga, and the AlGaAs layers under the $SiO_2$ are intermixed 36 by vacancy enhanced intermixing. On the other hand, the $Si_3N_4$ capped regions remain essentially unchanged [2].

There are various alternate means of patterning the surface within the scope of the invention. For example, the regions capped with $Si_3N_4$ can be left bare [7]; or the $Si_3N_4$ could be deposited and patterned before the $SiO_2$, which would then be added over the entire surface. Other material combinations and annealing environments could be used to perform the laterally patterned vacancy-enhanced intermixing.

Figure 8:
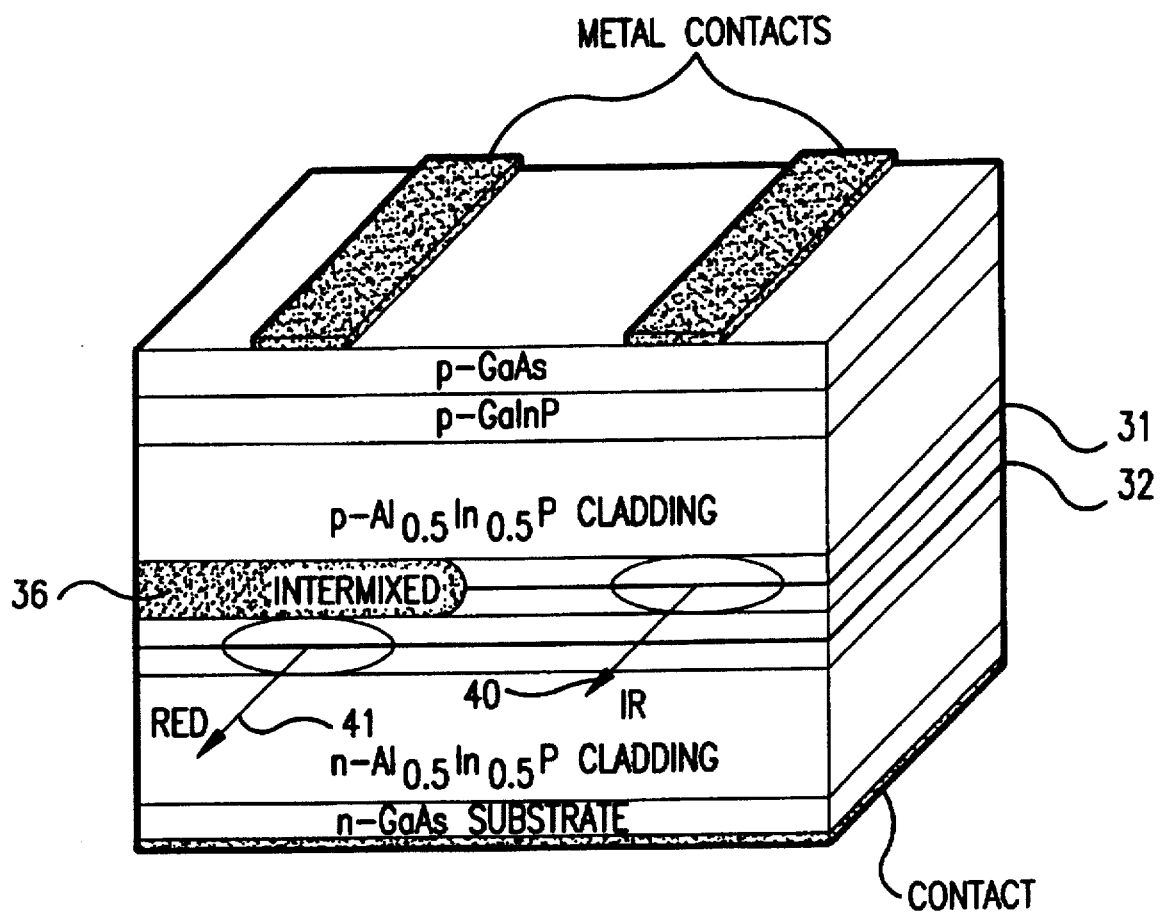
FIG. 8 is a perspective view of another form of semiconductor laser in accordance with the invention.

Following the patterned intermixing of the AlGaAs active region, stripe lasers are formed by established methods. See FIG. 8 as one example. One stripe passes current through the portion on the right which has had no intermixing and which emits an infrared laser beam 40 from the AlGaAs active region; and the other stripe passes current through the intermixed portion on the left, which emits a red beam 41 from the AlGaInP active region, as shown in FIG. 8.

Arrays can be formed with more than two wavelengths by partially intermixing the IR active region, instead of complete intermixing. For example, after the first intermixing as shown in FIG. 7, in a right-hand portion of the device which was covered with $Si_3N_4$ 34 during the anneal and thus has active region 31 intact, a surface portion could be capped with $SiO_2$ (with other portions remaining covered in $Si_3N_4$), then annealed at a time which causes partial, but not complete intermixing of the active region 31. For example, its band gap could be shifted from emitting at 850 nm to emitting at 800 nm. Thus, the resultant structure would contain the 680 nm emitter at the left, as before, and the structure at the right would now have two side-by-side emitters, emitting, respectively, at 850 nm where no intermixing of region 31 occurred and 800 nm where partial intermixing of region 31 occurred. In addition, the IR active region could contain InGaAlAs which allows for longer emission wavelength. An example of the latter is active region 31 containing an InGaAs QW with GaAs or AlGaAs barriers to initially emit at wavelengths in the range of 890 nm to 1100 nm.

This technique is not limited to the AlGaAs and AlGaInP materials systems, but is equally applicable to other materials combinations for which a difference in intermixing coefficients can be utilized. Examples of such other systems include other III–V materials such as active regions of InGaAs, InAlGaAs or GaInP, and claddings such as AlInP or AlGaInP, as well as II–VI materials.

The benefits of forming a stacked active region multiple-wavelength laser array by the methods described here, compared to an etch-and-regrow process, can be summarized as follows:

1. A regrowth near the active region is not required. This will have great benefits in terms of both initial device characteristics and reliability.

2. The resulting top surface of the laser array would be planar.

3. Each different wavelength device would have essentially the same waveguide, and thus more similar beam characteristics. (In the case of the etch and regrow process, a portion of the waveguide is removed with each active region removed by etching, resulting in much thinner waveguides for the shorter wavelength emitters).

In addition, for certain embodiments, no dopant is needed in the active region. This may have some benefits for device operation.

It is preferred to provide an $SiO_2$ cap over the region sought to be intermixed, as an $SiO_2$ cap enhances the intermixing of the AlGaAs quantum well by providing Ga vacancies, while material under an $Si_3N_4$ cap remains essentially unchanged as illustrated in FIG. 7. The AlGaInP quantum well under the $SiO_2$ cap undergoes much less intermixing than the AlGaAs quantum well, because of the much smaller Al—Ga interdiffusion coefficient in the AlGaInP. However, it will be understood that the invention is not limited to an $SiO_2$ cap, and other vacancy inducing materials may be substituted.

The previous description involved growth of all of the layers in the structure before intermixing the desired layers. A variation in accordance with the invention would be to interrupt the growth at any point after the growth of the active layers; followed by intermixing the desired layers and completion of the growth, referred to earlier as the second and third methods.

Figure 9A:
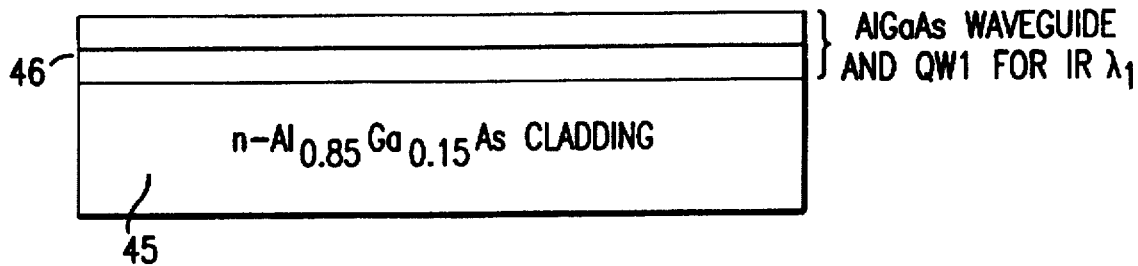
FIGS. 9(a)–9(c) show another way of making a semiconductor device according to the invention.
Figure 9B:
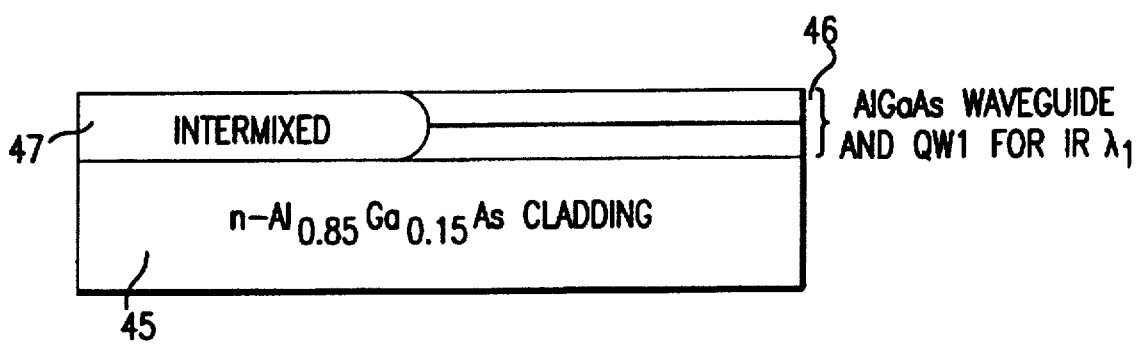
Figure 9C:
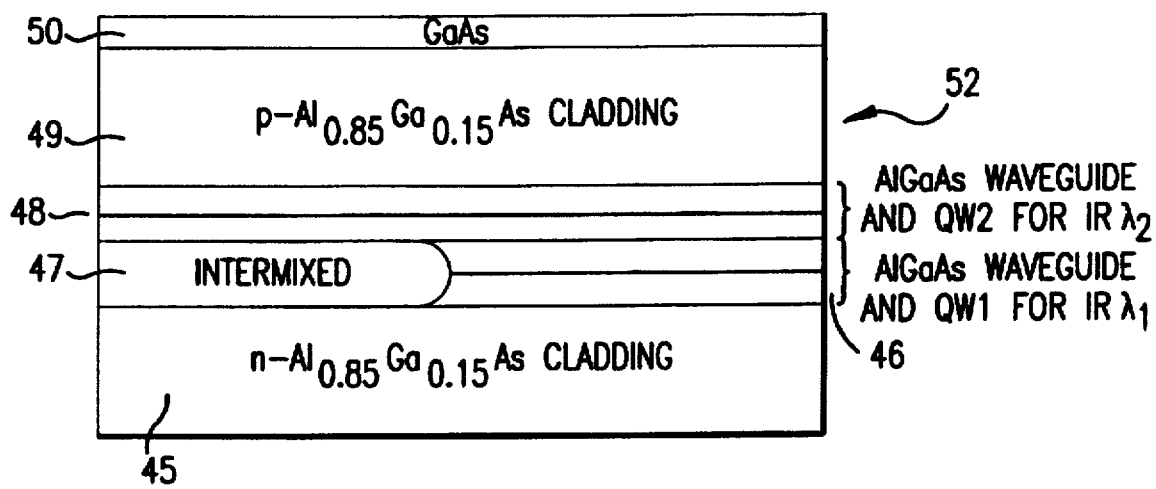

This variation is pictured in FIG. 9. The method consists of growing the lower cladding layer 45 and first active region 46 in a first growth step [FIG. 9(a)]. Then portions 47 of the active region 46 are intermixed in a laterally patterned fashion [FIG. 9(b)]. This intermixing could be accomplished by the technique described above for intermixing a buried doped layer; or it could be accomplished by the more conventional methods of impurity-induced layer disordering from a surface source, or vacancy intermixing. Following the intermixing, the remainder of the structure is grown, consisting of a second active region (with emission wavelength shorter than the first active region) 48, upper cladding 49; and capping layer 50. More than two active regions could be included if desired in this technique. The growth would be interrupted after each new active region (which would have a wavelength shorter than the ones below it), and the active regions would be intermixed in a patterned fashion so that different portions of the array would have different numbers of intact active regions, and hence different wavelengths. But, however accomplished, in each lateral region of the common body 52, intended as an individually-addressable laser source, all active QW layers of smaller band gap than that of the one desired to emit in that region are intermixed with a constituent that will form larger band gap layers so that, during operation, the non-intermixed smaller band gap layer will preferentially emit as desired.

Figure 10:
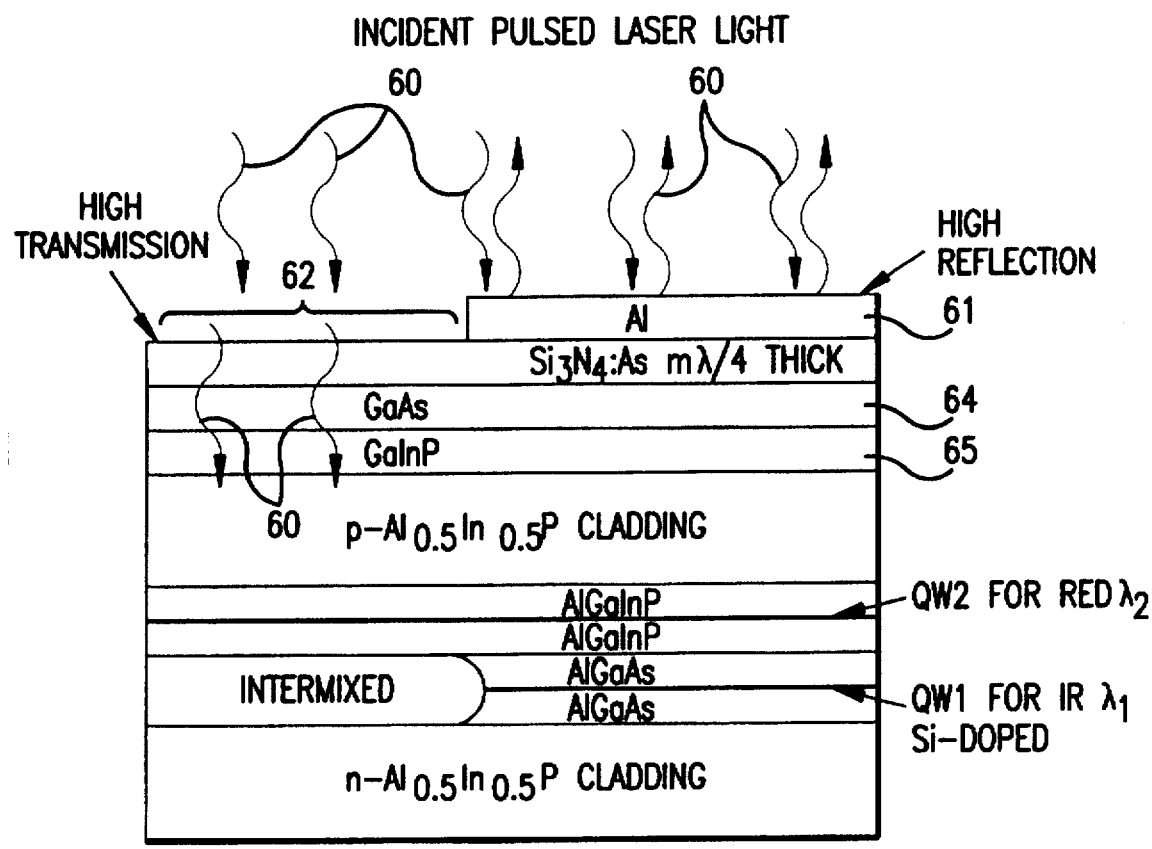
FIG. 10 is a schematic cross-section of a semiconductor device according to the invention fabricated by an alternate technique.

FIG. 10 is a further variation of the intermixing of a buried doped layer, with a pulsed UV laser as the source of heat 60. The compositions of the various layers are included in FIG. 10, with a Si-doped AlGaAs QW1 for IR $\lambda_1$, and an AlGaInP QW2 for red $\lambda_2$. Lateral patterning is achieved by patterning the surface into regions 61 of high reflection and regions 62 of high transmission to the pulsed laser light rays 60. In the transmissive regions 62, the active layers are heated by the transmitted radiation 60 to result in intermixing of the doped IR quantum well QW1, leaving the undoped quantum well QW2 for red emission intact. The reflecting layer 61 prevents the laser light 60 from reaching and heating the active regions. It is not necessary that the layers above the active regions are transparent. If they are absorbing, the heat will be conducted to the active regions raising the temperature there high enough to initiate intermixing. It is necessary that the laser light be significantly absorbed in some layer of the structure, i.e., it must be of photon energy higher than the band gap of some layer in the structure. Laser light with a wavelength shorter than 600 nm is suitable for the materials listed in FIG. 10. Alternatively, the patterning could be accomplished by scanning a focussed and modulated laser beam so that its radiation is absorbed primarily in the lateral regions where intermixing is desired.

In connection with the FIG. 3 illustration, where the second active layer or region 15 is a QW active region comprising an $Al_xGa_{1-x}As$ quantum well, then preferably $Al_yGa_{1-y}As$ barrier layers are provided on each side (with $1 \geq y > x \geq 0$). Alternatively, the barrier on one side could have a composition $Al_zGa_{1-z}As$ with $z > x$. Then under annealing (with appropriate cap) the Al and Ga intermix with Al moving from the barrier into the quantum well, and Ga moving oppositely. This raises the band gap of the quantum well where desired.

In this case, as noted in connection with FIG. 4, the selective intermixing of QW and barrier regions is promoted by an interdiffusion coefficient (i.e., rate) for the second QW active region that is much higher than for the first QW active region. Where the first active region contains AlGaInP quantum well and barriers, e.g., QW: $Al_xGa_yIn_{(1-x-y)}P$; barrier: $Al_{x1}Ga_{y1}In_{(1-x1-y1)}P$ (x1>x), preferably the second active region contains AlGaAs quantum well and barriers, e.g., QW: $Al_zGa_{1-z}As$; barrier $Al_{z1}Ga_{(1-z1)}As$, (z1>z), and the coefficient for interdiffusion of Ga and Al is much higher for the AlGaAs second active region.

While not shown, as is known, it may be desirable to incorporate isolation, such as by a groove, between the side-by-side lasers of FIGS. 3 and 8.

While the examples given have shown the combination of two IR wavelengths, or the combination of one IR and one red wavelength, the methods described could be used to form in other III-V compound bodies structures with two IR wavelengths, structures with two red wavelengths, structures with one red and one IR wavelength, combinations and multiples of these, or more generally an arbitrary set of emission wavelengths of sufficient spectral separation.

Figure 11A:
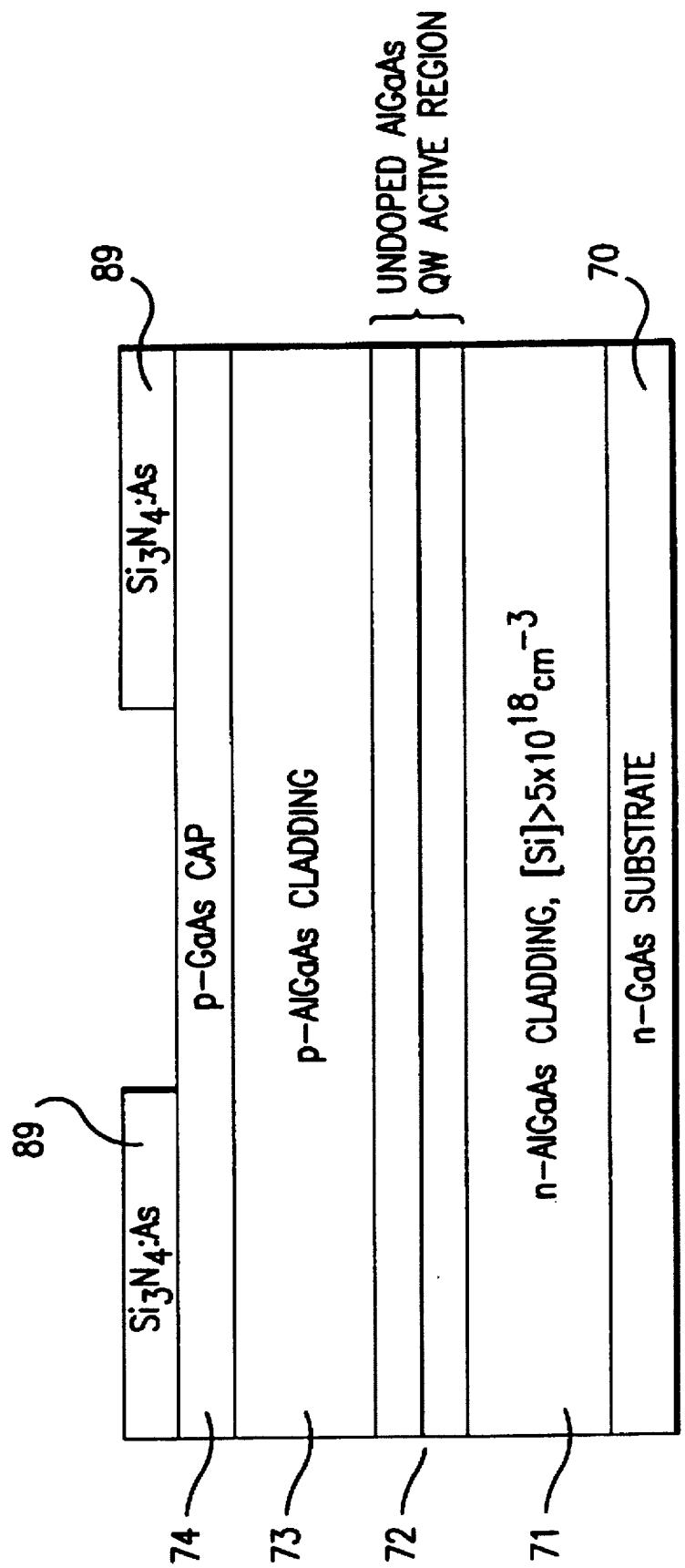
FIGS. 11a and 11b are cross-sections showing the fabrication of a particular III–V structure according to the invention.
Figure 11B:
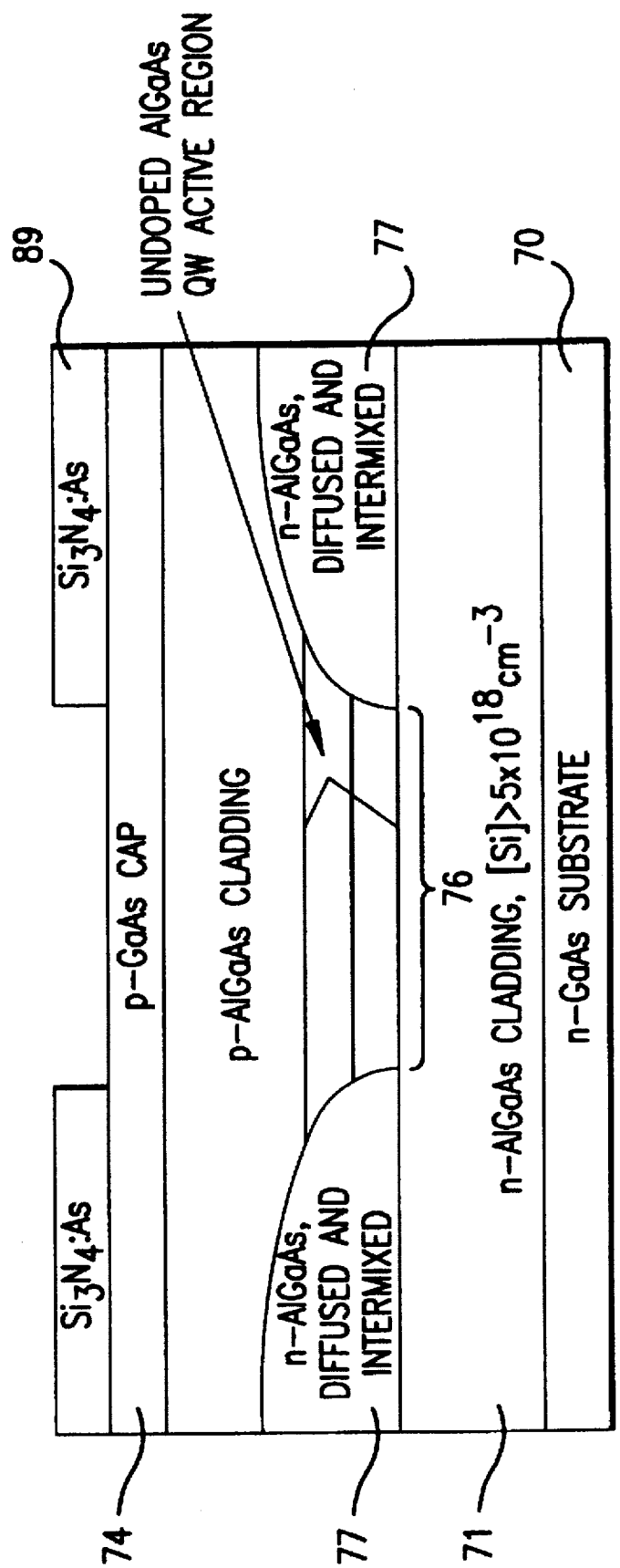

In the description given above in connection with the stacked array of FIG. 3, one method to eliminate the unwanted region 20 is to incorporate Si in layer 15 as grown, and employ selective capping conditions to control where intermixing occurs to raise the band gap of region 20. There will now be described a number of other embodiments of the invention wherein a buried impurity source is used to form the flanking index-guiding regions for the laser diode's active region. This aspect of the invention in its simplest form is depicted in FIGS. 11a and 11b for an AlGaAs laser structure, in which FIGS. 11a and 11b show the structure before and after annealing, respectively. The structure comprises a substrate 70 on which are grown a lower cladding layer 71, a QW active region 72, an upper cladding layer 73, and a cap layer 74. The difference between this structure and conventional laser structures lies in the doping of the n-side cladding layer 71. In this case, it is doped with silicon at a level much higher than normal. This provides the source of impurities for IILD of the waveguide. The doping level needs to be higher than about $5 \times 10^{18}$ cm$^{-3}$, in order to provide a sufficient concentration of Si diffusing into the waveguide 72 at reasonable times and temperatures. During the anneal, IILD takes place via Si diffusion through the waveguide. By proper patterning of surface conditions, the IILD can be permitted to progress in the regions outside of the stripe 76, while under the stripe it is stopped or slowed considerably, so that the waveguide and QW are insignificantly affected under the stripe. Various possible capping conditions to achieve this are described below. During the anneal, the IILD results in intermixed regions 77 outside the stripe 76 that have higher band gap and lower refractive index than the stripe region, which give lateral electrical and optical confinement, as in conventional IILD index-guide lasers.

Figure 12A:
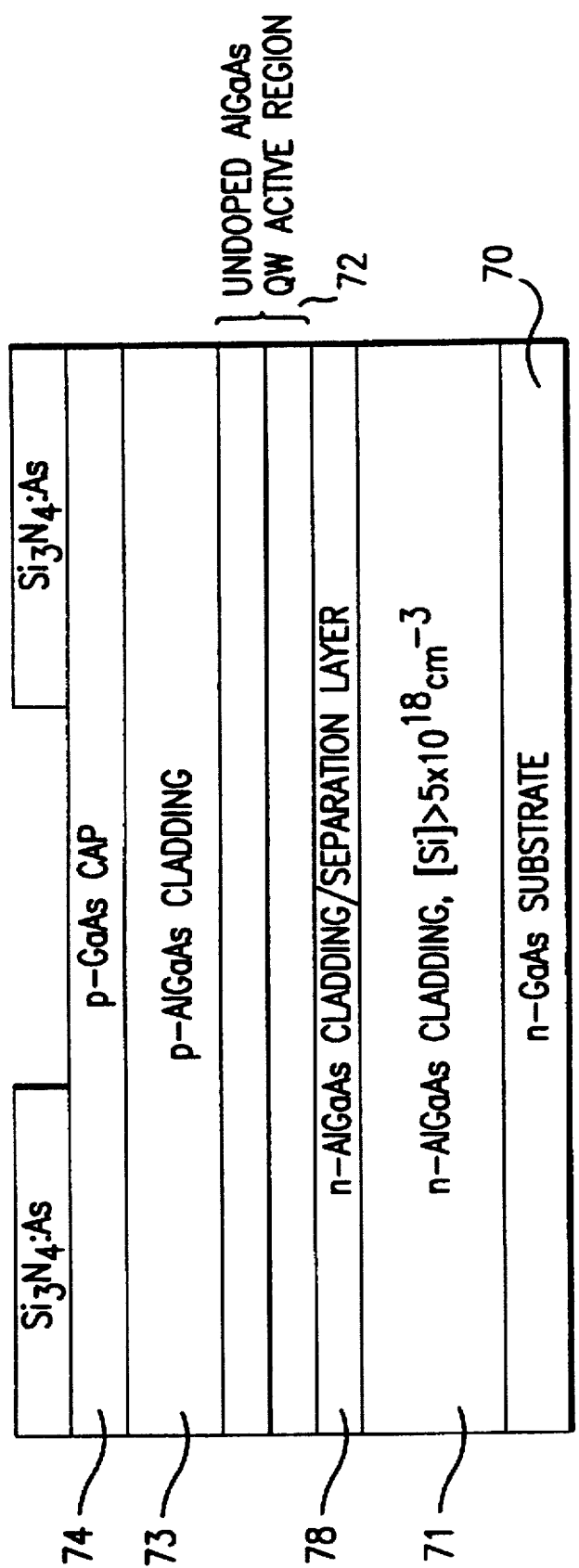
FIGS. 12a and 12b are cross-sections similar to FIGS. 11a and 11b of a modification.
Figure 12B:
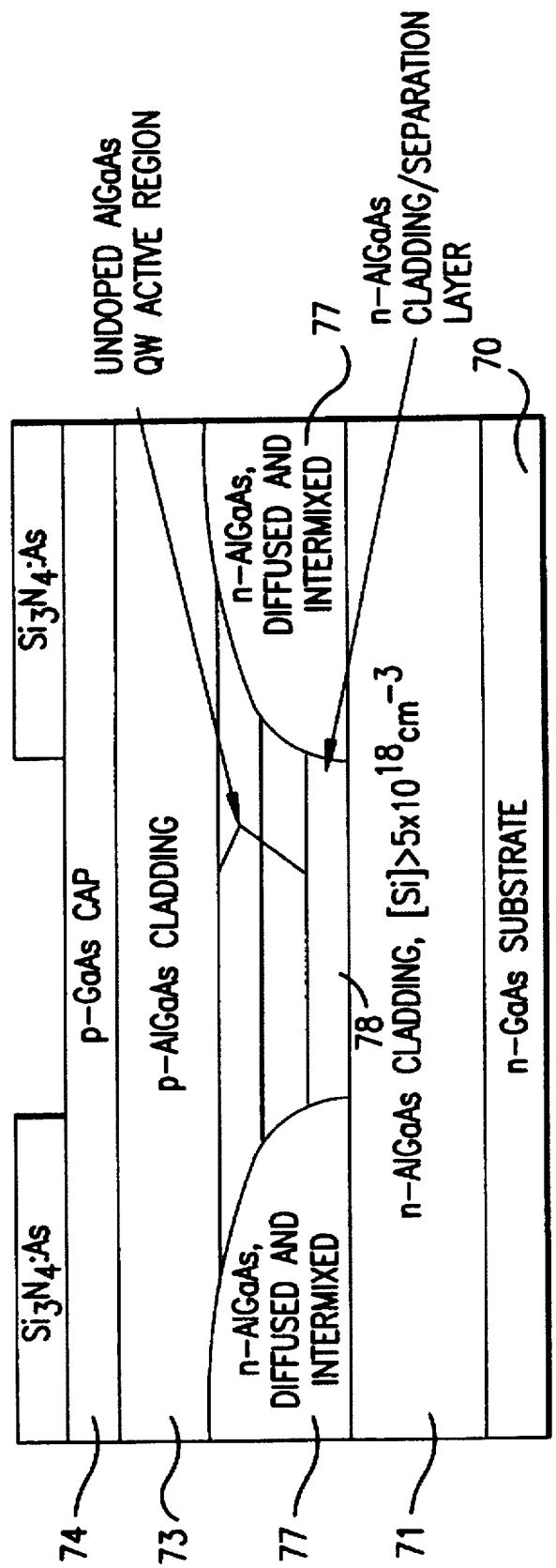

One possible disadvantage to this technique is that the high level of doping in the cladding layer 71 will increase the free carrier absorption losses of the device. This leads to an increase in threshold current and to a decrease in efficiency. To mediate the free carrier absorption in the stripe region, the impurity source could be moved away from the waveguide somewhat, as shown in FIGS. 12a and 12b, before and after annealing, respectively, by provision of a Si-free separating layer 78. Then a smaller fraction of the optical mode will overlap the heavily doped region 71, resulting in decreased free carrier losses. The inclusion of a more lightly doped separation layer 78 next to the waveguide may also increase the ability to inhibit significant IILD in the stripe region 76. As in the previous example, the Si diffuses from the cladding layer 71 through the waveguide during the anneal to a limited distance, initiating IILD in regions controlled by surface patterning.

Figure 13A:
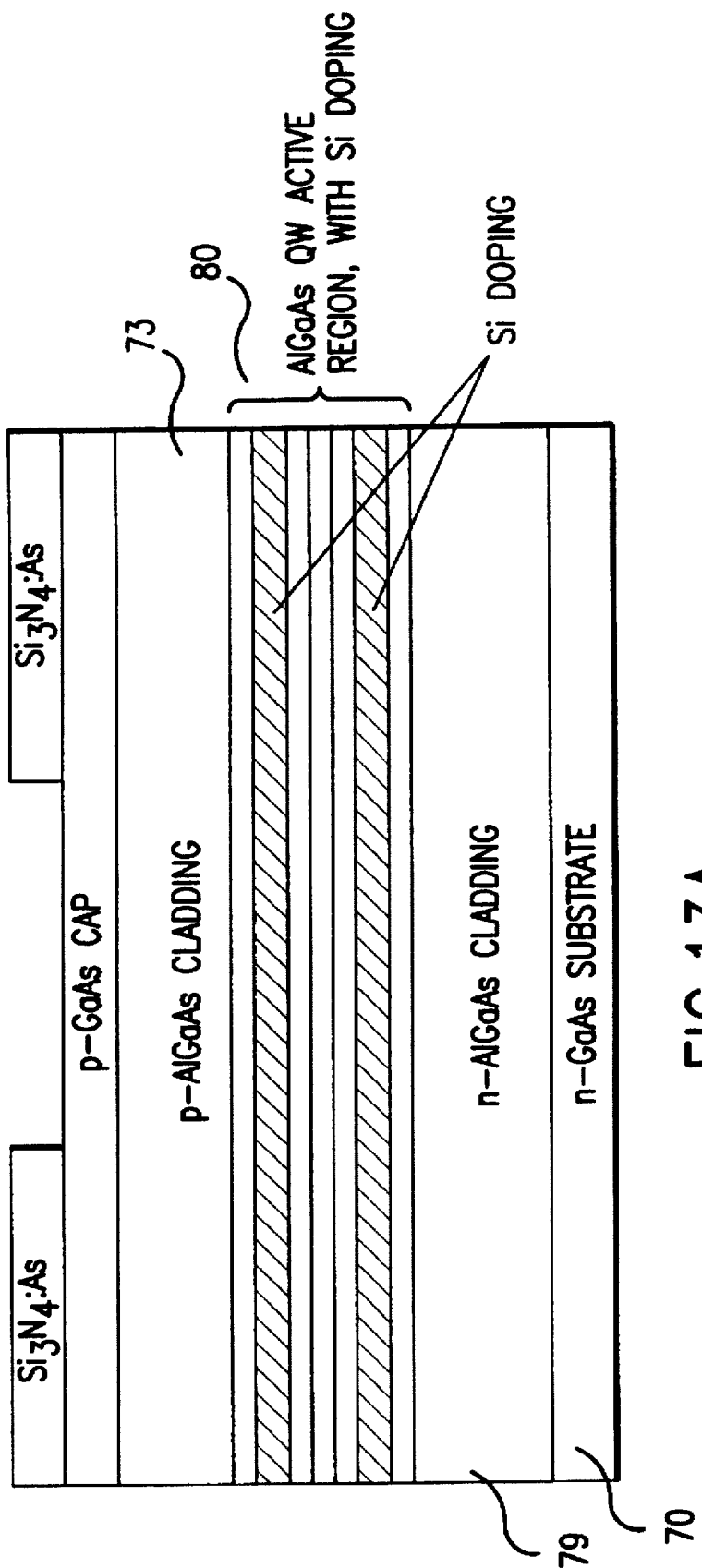
FIGS. 13a and 13b are cross-sections similar to FIGS. 11a and 11b of a further modification.
Figure 13B:
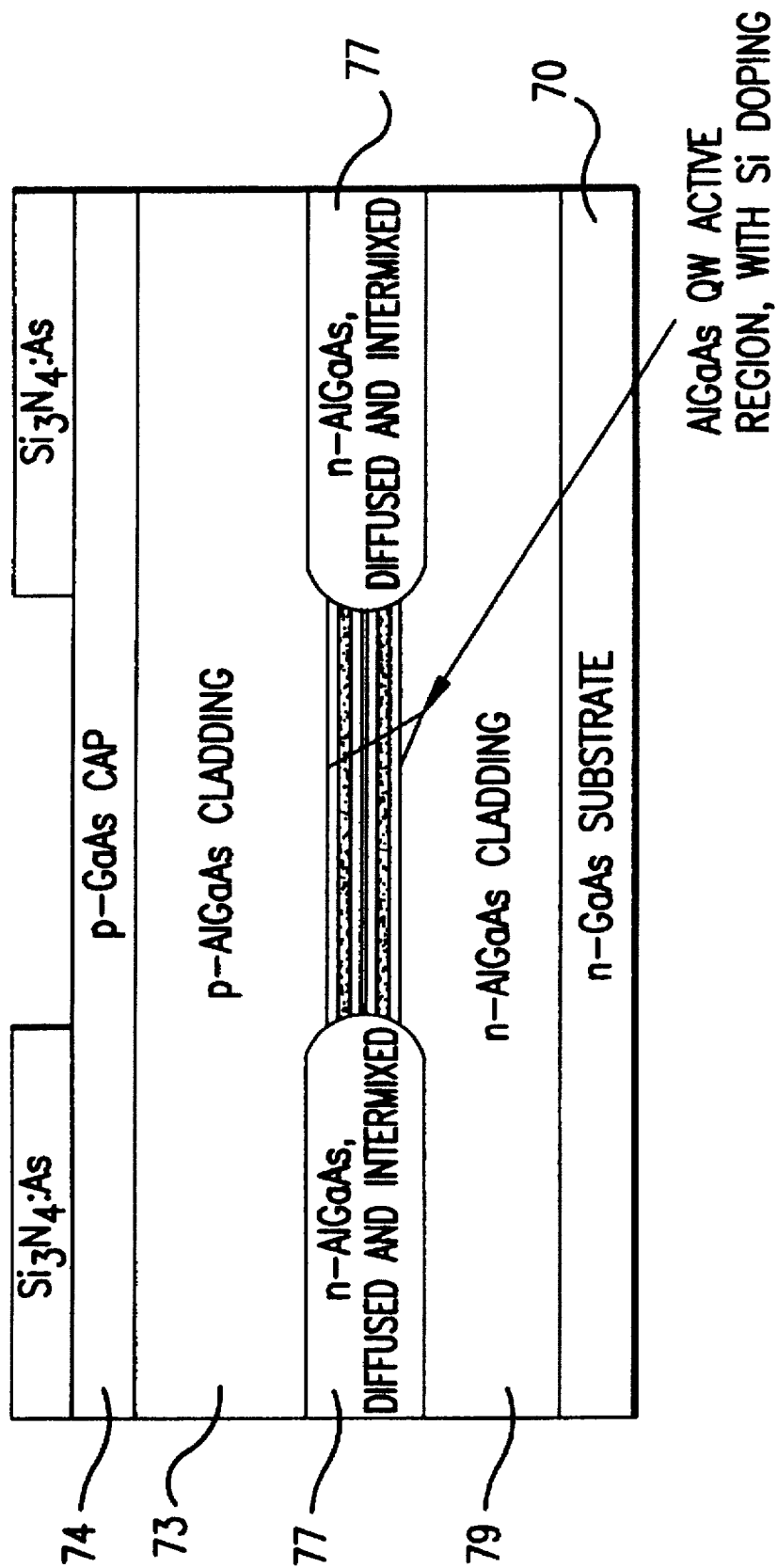

FIGS. 13a and 13b show another alternative in placement of the buried impurity source. Rather than placing the impurity source in the lower cladding layer, the impurity is contained in the waveguide region 80, as shown. In this case, the Si diffuses outward, initiating IILD in regions 77 selected by surface patterning. In this alternative, the lower cladding layer 79 has the conventional doping.

Figure 14:
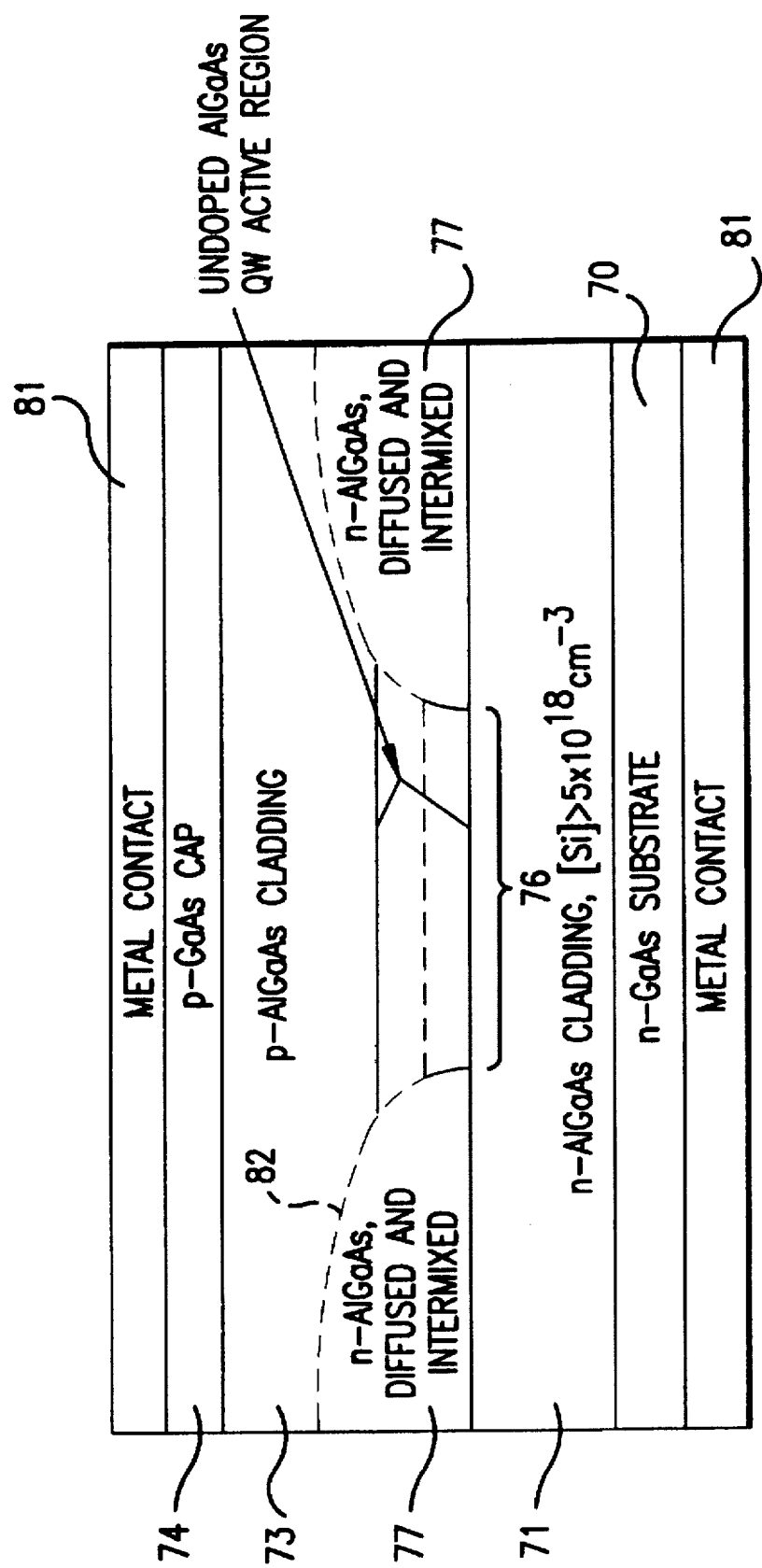
FIG. 14 illustrates the structure of FIG. 11b after contacting.

Whichever one or combination of initial impurity placements is used, the structure following the anneal is similar. The example from FIG. 11 is shown in FIG. 14 after the removal of the silicon nitride and the addition of metal contacts 81 to allow for the passage of current through the device. The p-n junction is shown as the dashed curve 82.

Figure 15:
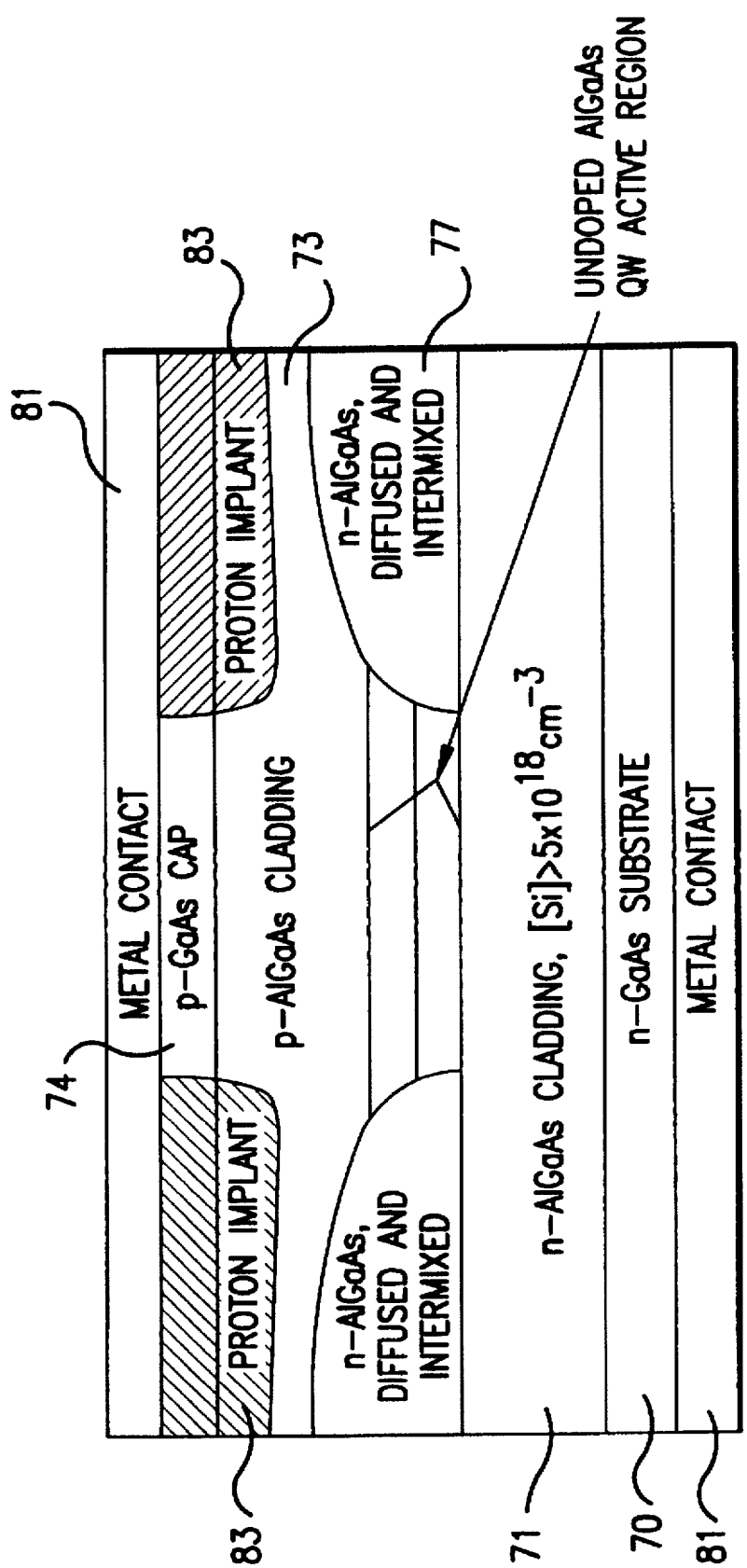
FIGS. 15–18 are cross-sections similar to FIG. 14 showing additional variations.
Figure 16:
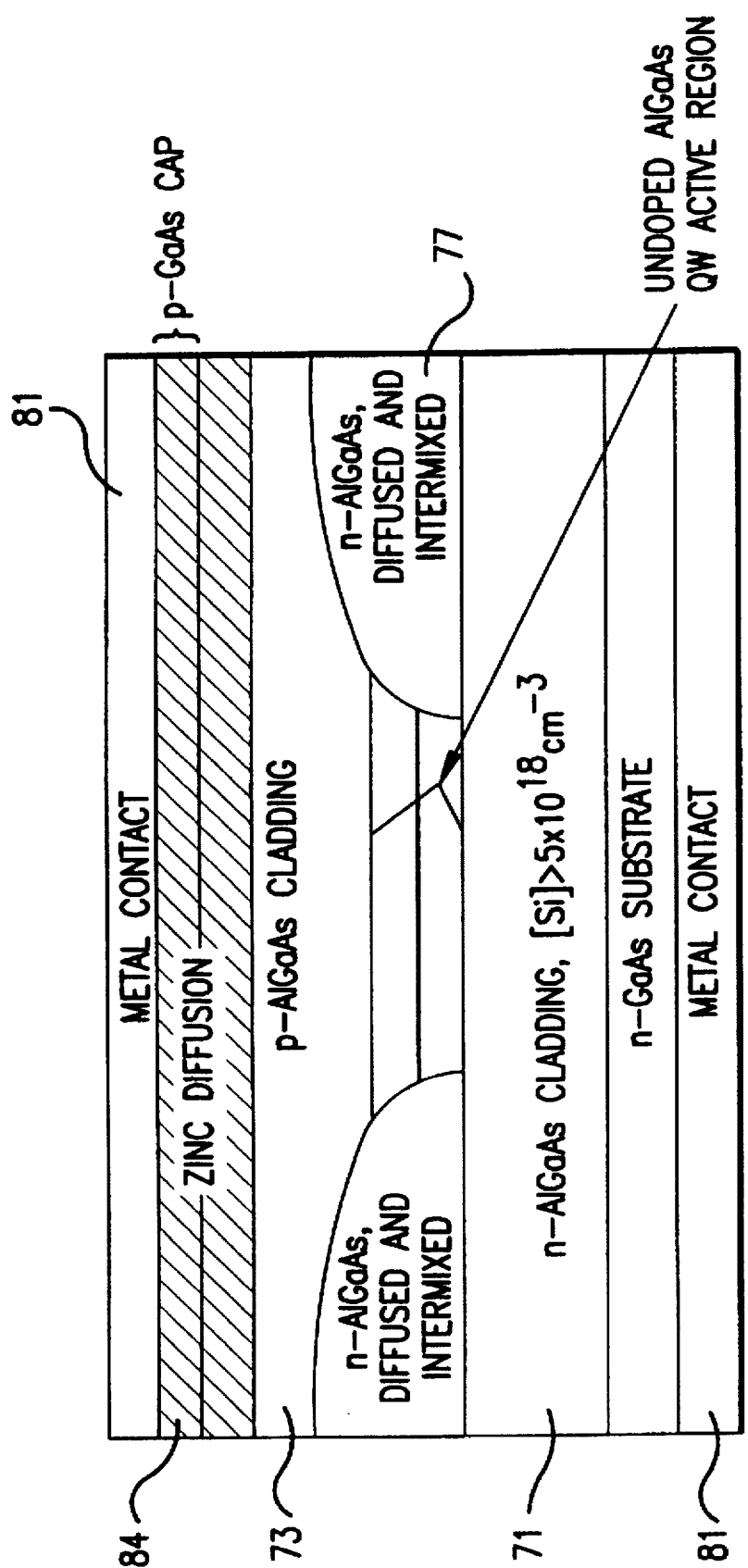
Figure 17:
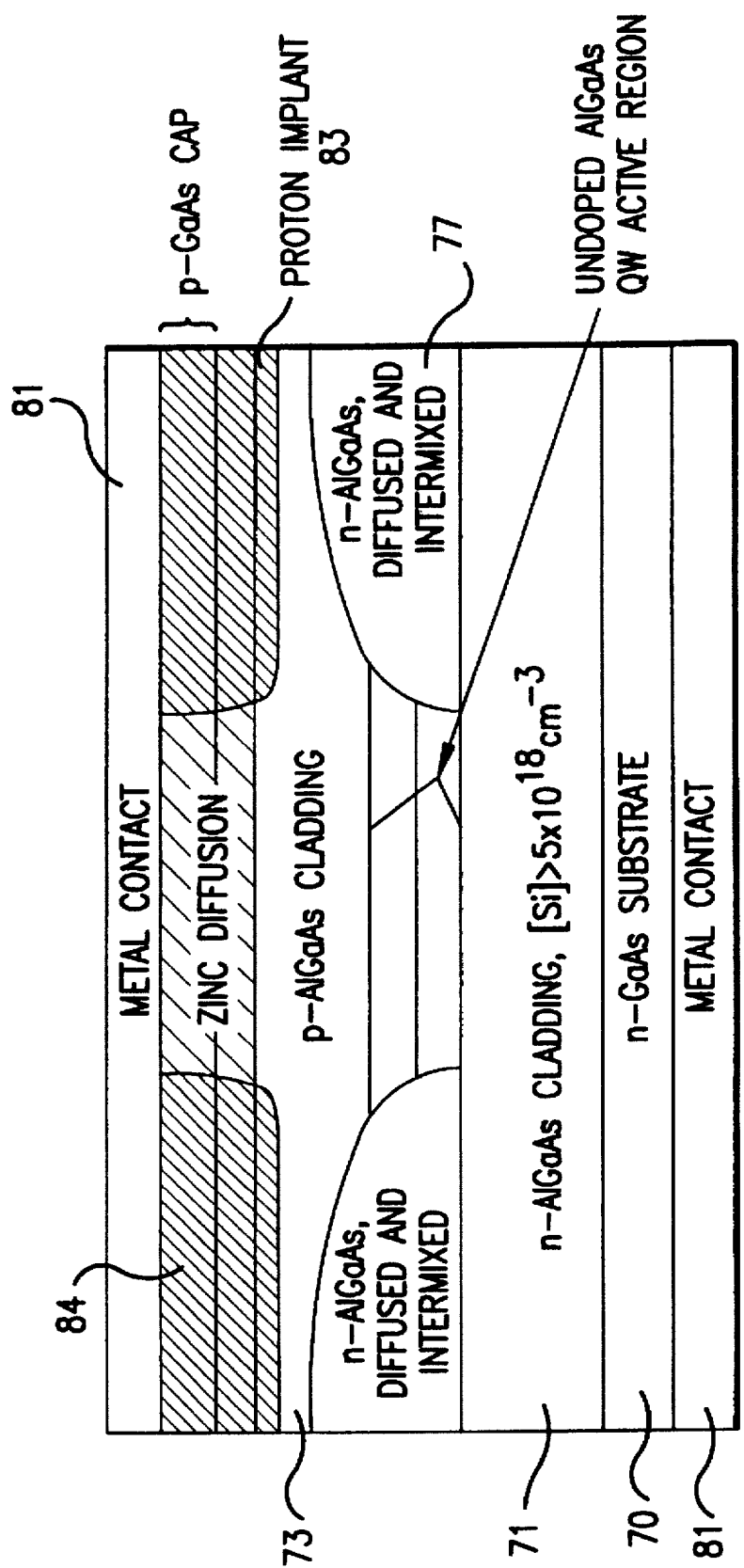

Since the p-n junction 82 outside of the stripe 76 is in high band gap cladding layer material 73, it has a higher turn-on voltage than the p-n junction in the lower band gap active region inside the laser stripe. As a result, there is only a small degree of leakage current outside of the stripe. However, the leakage can be further reduced by implantation of protons or other ions to convert the upper regions of the device outside of the stripe to highly resistive material, as depicted at 83 in FIG. 15. This also increases electrical isolation between devices on the same chip. In order to reduce the top contact resistance, it may be beneficial to perform a zinc diffusion 84 as in FIG. 16, shown for a device without ion implantation, or preferentially with both zinc diffusion and ion implantation, as in FIG. 17.

While not shown, reflectors are formed at opposite ends of the device, typically by cleaving, to form the usual optical cavity.

Figure 18:
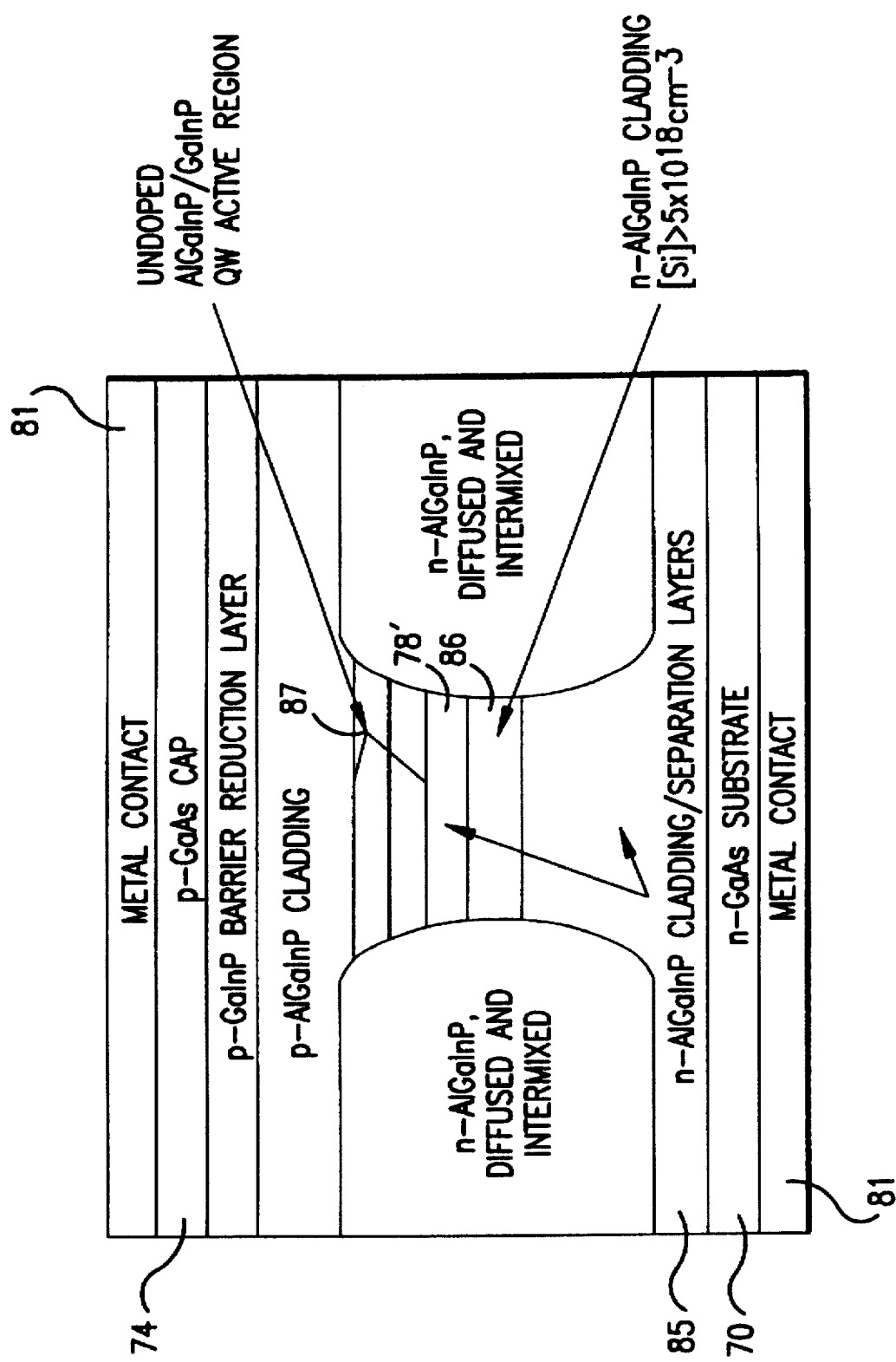

So far, the examples have dealt with devices in the AlGaAs material system. For red-emitting lasers in the AlGaInP/GaAs materials system, there is an additional issue regarding intermixing of layers containing P with layers containing As. When such layers intermix, it is likely that lattice mismatch and strain will result, eventually leading to the formation of defects which can be deleterious and potentially fatal to device operation. Therefore, additional care must be taken in the choice of impurity location in the structure. FIG. 18 shows an AlGaInP/GaAs laser structure similar to the AlGaAs/GaAs structure in FIG. 12. The important difference here (other than the change in materials) is the inclusion of an extra separation layer 85 between the heavily doped Si source layer 86 and the substrate 70. This separation layer 85 needs to be of sufficient thickness that Si diffusing from the source layer 86 does not reach the interface between the AlGaInP cladding layer 85 and the GaAs substrate 70. Without this layer, the cladding layer would intermix with the substrate, most likely accompanied by the creation of defects. A partial cladding layer 78' is provided between the Si-source 86 and the active region 87.

An important aspect of this technique is the ability to use surface conditions to control whether or not IILD takes place in a certain region of the structure. Various possible surface conditions to allow for such control are pictured in FIGS. 19a and 19b for an AlGaAs/GaAs structure. Only the top layers of the laser structure are shown. In FIG. 19(a), the regions where IILD is to take place are covered with silicon nitride 89 which may or may not contain As, and the regions where IILD is not to take place are left bare. During the anneal without As overpressure, the bare surface loses As, resulting in an As-poor condition. It has been shown previously that an As-poor annealing ambient suppresses IILD in n-type material, while an As-rich ambient promotes IILD in n-type material. We have confirmed that patterning an AlGaAs structure as shown in FIG. 19(a) results in significantly slower IILD around the doped layer under the bare surface than under the silicon nitride. In FIG. 19(b), SiO$_2$ 90 is used to provide a source of column III vacancies to promote Si diffusion and intermixing on the column III sublattice.

In the case of a red-emitting laser in AlGaInP/GaAs, the same surface conditions can be used. Alternatively, the GaAs cap could be etched off, and the analogous surface conditions utilized with As replaced by P. As an additional alternative in the AlGaInP/GaAs case, the GaAs cap can be removed only in areas outside of the stripe region, and capping conditions applied as shown in FIG. 20(a), wherein IILD is promoted outside the stripe by excess P in the nitride 94, while IILD is inhibited under the stripe by an As-poor condition. In FIGS. 20(b), the SiO$_2$ 95 provides a source of column III vacancies to promote Si diffusion and intermixing on the column III sublattice.

It will be understood that in the fabrication of the embodiments of FIGS. 13(a) and (b), the active region 80, normally undoped as in the other embodiments, due to the presence of the silicon doping, actually becomes a doped active region exhibiting n-type conductivity. Intermixing is prevented at the striped region by the uncapped surface over the latter and by the absence of an overpressure of the V constituent of the III-V compound, As for GaAs, or P for GaInP. As a result, out-diffusion of As occurs and As is lost from the uncapped surface during annealing and this prevents the undesired intermixing. The referenced paper [4] uses a different approach. In the paper, a $(Si_2)_y(GaAs)_{1-y}$ alloy is formed inside of the active layer. The outer active layer parts remain undoped. To form the flanking index-guided regions, the SiO$_2$ cap outside of the striped region is essential during the annealing step with an As overpressure to promote Ga vacancies that will decompose the alloy and free-up Si for intermixing. Because of the As overpressure, no arsenic is lost during out-diffusion, and thus the referenced paper does not rely on the loss of the V component from the surface to prevent intermixing as is done in this aspect of the invention. Moreover, this aspect of the invention does not require an external source of Ga vacancies to promote intermixing.

In cases where the stripe surface is exposed to an As-poor annealing condition, the loss of As from the surface results in higher diode turn-on voltage and series resistance in the finished devices. A zinc diffusion, as mentioned with regard to FIGS. 16 and 17, should help improve the diode's electrical characteristics. Alternatively, or in addition, sacrificial layers could be included on top of the structure. These layers would then degrade during the anneal, but result in reduced degradation of the layers below. Following the anneal and removal of dielectric surface layers, these sacrificial layers would be removed by etching. By using the proper layer design, the removal could be done easily with selective etchants. Following the removal of the sacrificial layers, the devices would receive Zn diffusion, ion implant, and metal contacts, as in FIG. 17.

As discussed above, this technique will allow for lower temperature and shorter time for the IILD compared to the more conventional method of diffusion from a surface source for the formation of index-guided lasers in the AlGaInP/GaAs material system by IILD.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of making a multiple layer semiconductor device comprising the steps of:
   (a) providing a semiconductor substrate;
   (b) forming multiple layers over said substrate, in which at least one of said layers is doped and contains impurity atoms of a type and with a concentration adequate for impurity induced layer disordering of a limited amount of material;
   (c) intermixing said doped layer and its adjacent layers in selected lateral areas of said multiple layer structure by causing said impurities to diffuse in said selected areas but not to diffuse in other areas, wherein said doped layer has a smaller band gap than other layers in said multiple layer structure and the intermixing step causes the band gap of this doped layer to increase.

2. A method of making a multiple layer semiconductor device comprising the steps of:
   (a) providing a semiconductor substrate;
   (b) forming multiple layers over said substrate, in which at least one of said layers is doped and contains impurity atoms of a type and with a concentration adequate for impurity induced layer disordering of a limited amount of material;
   (c) intermixing said doped layer and its adjacent layers in selected lateral areas of said multiple layer structure by causing said impurities to diffuse in said selected areas but not to diffuse in other areas,
wherein said doped layer comprises a material wherein the diffusion coefficient is much higher than in other layers of said multiple layer structure.

3. In a method of forming side-by-side first and second lasers emitting at different wavelengths by forming in a common body first and second stacked active layers lasing, respectively, in shorter and longer wavelengths, and leaving active the second active layer in the second laser but effectively eliminating the second active layer in the first laser by the step of selectively intermixing to raise the band gap of the second active layer in the first laser without intermixing the second active layer in the second laser or the first active layer in the first laser.

4. The method of claim 3, wherein the first active layer as-formed has a larger band gap than that of the second active layer as-formed, and the selective intermixing step causes the band gap of the second active layer in the first laser to increase to a value above that of the first active layer.

5. The method of claim 3, wherein the first active layer is of AlGaInP, the second active layer is an AlGaAs multiple layer structure layer comprising an AlGaAs quantum well and barrier whose Al—Ga interdiffusion coefficient is much higher than in AlGaInP in the presence of the capping material whereby the interdiffusion in the AlGaAs active region increases the band gap of the AlGaAs active region to a value above that of the AlGaInP active region.

6. The method of claim 3 wherein said first and second active layers are stacked active layers which are sandwiched between common cladding layers.

7. The method of claim 3 wherein each of said first and second lasers is controlled by biasing a planar p-n junction.

8. The method of claim 3 wherein the p-n junction of each of said first and second lasers share common p-type and n-type regions.

9. A method of making an index-guided semiconductor laser by impurity-induced layer disordering comprising the steps of:
   (a) providing a semiconductor body portion;
   (b) forming a lower cladding layer over said body portion;
   (c) forming an active layer over said lower cladding layer and an upper cladding layer over the active layer; said structure having in said active layer laterally spaced impurity induced intermixed first portions flanking a non-intermixed second portion, said impurity induced intermixed first portions having a higher band gap than that of said non-intermixed second portion,
   (d) said structure having been formed by thermal annealing under conditions such as to cause impurities present in the lower cladding layer to diffuse to and substantially intermix, and raise the band gap of, said first portions but not to diffuse to and substantially intermix said second portion and third portions of said upper cladding layer overlying the first portions.

10. The method of claim 9, wherein said structure has active regions constituted of AlGaAs, InGaAs, InAlGaAs, GaInP, or AlGaInP.

11. The method of claim 9, wherein a first separation layer containing an impurity concentration below that necessary for intermixing is provided between the lower cladding layer and the active layer.

12. The method of claim 9, wherein the body portion contains GaAs and the lower cladding layer comprises GaInP or AlGaInP, and a second separation layer containing an impurity concentration below that necessary for intermixing is provided under the lower cladding layer containing the impurity.

13. A planar laser array comprising:
   (a) a common semiconductor body, said body comprising:
      (i) a substrate,
      (ii) a lower cladding layer over the substrate,
      (iii) first and second stacked active layers over the lower cladding layer,
      (iv) an upper cladding layer over the stacked active layers,
   (b) first and second side-by-side lasers formed in laterally spaced regions of the body, each of the first and second lasers comprising the substrate, the lower and upper cladding layers, and the first and second stacked active layers,
   (c) the portions of the first active layer present in both the first and second lasers having a first band gap,
   (d) the portion of the second active layer in the second laser having a second band gap lower than the first band gap,
   (e) the portion of the second active layer in the first laser being intermixed with constituents of at least one of the adjacent layers and having a third band gap larger than the first band gap,
   (f) contacts to the body for individually addressing the first and second lasers.

14. The laser array of claim 13, wherein the first active layer is of AlGaInP or GaInP, and the second active layer is of AlGaAs or InGaAs or InAlGaAs.

15. The laser array of claim 13, wherein the first active layer is InGaAs, AlGaAs or InAlGaAs and the second active layer is InGaAs, AlGaAs, or InAlGaAs.

16. An index-guided laser diode comprising:
   (a) a semiconductor body comprising:
      (i) a substrate,
      (ii) a lower cladding layer over the substrate,
      (iii) an active layer doped with impurities over the lower cladding layer,
      (iv) an upper cladding layer over the active layer,
   (b) laterally spaced portions of the active layer forming impurity-intermixed first regions flanking a non-impurity-intermixed second region of the active layer,
   (c) the second region of the active layer having a first band gap,
   (d) the first regions of the active layer having a second band gap higher than the first band gap,
   (e) portions of the upper cladding layer overlying the first regions being free of the impurities forming the disordered first regions, wherein the impurity forming the intermixed regions is present in a portion of the lower cladding layer.

17. The diode of claim 16, wherein a layer containing insufficient impurities to cause intermixing separates the portion of the lower cladding layer from the second region of the active layer.

18. The diode of claim 16, wherein the impurity is present as a dopant throughout the active layer in both said first regions and second region.

19. The method of claim 3, wherein the selective intermixing step is carried out by selectively introducing in the body within or adjacent the second active layer in the first laser an impurity at a concentration such that, when the body is thermally annealed, only the undesired second active layer in the first laser is significantly intermixed.

20. The method of claim 3, wherein the selective intermixing step is carried out by introducing into the body an impurity, capping the body in lateral regions where the second active layer is to be eliminated, and thermally annealing the body.

21. The method of claim 3, wherein the intermixing step is carried out by capping the body in lateral regions over where the second active layer is to be eliminated with a capping material, and thermally annealing the body, said capping material having a composition that acts as a source of vacancies and promotes vacancy-enhanced intermixing, the material of the second active layer during vacancy-enhanced intermixing having a much greater interdiffusion coefficient than the material of the first active layer.

22. The method of claim 21, wherein the second active layer comprises an $Al_xGa_{1-x}As$ QW and an $Al_yGa_{1-y}As$ barrier with $1 \geq y > x \geq 0$ on one or both sides or with an $Al_zGa_{1-z}As$ barrier on the other side, where $z > x$.

23. The method of claim 21, wherein the capping material is $SiO_2$.

24. The method of claim 21, wherein the body portions over regions where the second active layer is not to be eliminated are capped with $Si_3N_4$.

25. The method of claim 3, wherein the selective intermixing step is carried out by introducing in the vicinity of the second active layer an impurity which induces intermixing and scanning the body in a patterned fashion with a focussed laser beam that raises the second active layer to a temperature above that at which thermal intermixing takes place.

26. The method of claim 3, wherein the selective intermixing step is carried out by introducing in the vicinity of the second active layer an impurity which induces intermixing and providing a pattern of reflective areas over the body where selective intermixing is not wanted, and irradiating the body with radiation to heat the second active layer in regions not covered by said reflective areas to above the temperature where intermixing takes place.

* * * * *